(12) United States Patent
Juengling

(10) Patent No.: US 7,842,558 B2
(45) Date of Patent: Nov. 30, 2010

(54) MASKING PROCESS FOR SIMULTANEOUSLY PATTERNING SEPARATE REGIONS

(75) Inventor: Werner Juengling, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 106 days.

(21) Appl. No.: 11/367,020

(22) Filed: Mar. 2, 2006

(65) Prior Publication Data
US 2007/0205438 A1 Sep. 6, 2007

(51) Int. Cl.
*H01L 21/332* (2006.01)
(52) U.S. Cl. .................. 438/135; 257/216; 257/E21.19
(58) Field of Classification Search ................. 257/216, 257/135–136, 242, 329, E27.091, 27.095–27.096, 257/E29.118, E29.274, E29.313, E29.318, 257/E29.262
See application file for complete search history.

(56) References Cited

U.S. PATENT DOCUMENTS

| | | | |
|---|---|---|---|
| 4,234,362 A | 11/1980 | Riseman | |
| 4,419,809 A | 12/1983 | Riseman et al. | |
| 4,432,132 A | 2/1984 | Kinsbron et al. | |
| 4,502,914 A | 3/1985 | Trumpp et al. | |
| 4,508,579 A | 4/1985 | Goth et al. | |
| 4,570,325 A | 2/1986 | Higuchi | |
| 4,648,937 A | 3/1987 | Ogura et al. | |
| 4,716,131 A | 12/1987 | Okazawa et al. | |
| 4,776,922 A | 10/1988 | Bhattascharyya et al. | |
| 4,838,991 A | 6/1989 | Cote et al. | |
| 5,013,680 A | 5/1991 | Lowrey et al. | |
| 5,047,117 A | 9/1991 | Roberts | |
| 5,053,105 A | 10/1991 | Fox, III | |
| 5,117,027 A | 5/1992 | Bernhardt et al. | |
| 5,315,142 A | 5/1994 | Acovic et al. | |
| 5,319,753 A | 6/1994 | MacKenna et al. | |
| 5,328,810 A | 7/1994 | Lowrey et al. | |
| 5,330,879 A | 7/1994 | Dennison | |
| 5,398,205 A | 3/1995 | Yamaguchi | |
| 5,408,116 A | 4/1995 | Tanaka et al. | |

(Continued)

FOREIGN PATENT DOCUMENTS

DE 280 851 A1 7/1990

(Continued)

OTHER PUBLICATIONS

Bergeron et al., "Resolution Enhancement Techniques for the 90nm Technology Node and Beyond," Future Fab International, Issue 15, 4 pages.

(Continued)

*Primary Examiner*—Thao X Le
*Assistant Examiner*—Tony Tran
(74) *Attorney, Agent, or Firm*—Knobbe, Martens, Olson & Bear, LLP

(57) ABSTRACT

According to another embodiment of the present invention, a method comprises patterning a first plurality of semiconductor structures in an array portion of a semiconductor substrate using a first photolithographic mask. The method further comprises patterning a second plurality of semiconductor structures over a logic portion of a semiconductor substrate using a second photolithographic mask. The method further comprises patterning a sacrificial layer over the first plurality of semiconductor structures using the second photolithographic mask. The sacrificial layer is patterned simultaneously with the second plurality of semiconductor structures.

26 Claims, 27 Drawing Sheets

U.S. PATENT DOCUMENTS

| | | | |
|---|---|---|---|
| 5,470,661 A | 11/1995 | Bailey et al. |
| 5,502,320 A | 3/1996 | Yamada |
| 5,514,885 A | 5/1996 | Myrick |
| 5,670,794 A | 9/1997 | Manning |
| 5,679,591 A | 10/1997 | Lin et al. |
| 5,753,546 A | 5/1998 | Koh et al. |
| 5,789,320 A | 8/1998 | Andricacos et al. |
| 5,795,830 A | 8/1998 | Cronin et al. |
| 5,899,746 A | 5/1999 | Mukai |
| 5,905,285 A | 5/1999 | Gardner et al. |
| 5,981,333 A | 11/1999 | Parekh et al. |
| 5,998,256 A | 12/1999 | Juengling |
| 6,004,862 A | 12/1999 | Kim et al. |
| 6,010,946 A | 1/2000 | Hisamune et al. |
| 6,042,998 A | 3/2000 | Brueck et al. |
| 6,057,573 A | 5/2000 | Kirsch et al. |
| 6,063,688 A | 5/2000 | Doyle et al. |
| 6,071,789 A | 6/2000 | Yang et al. |
| 6,110,837 A | 8/2000 | Linliu et al. |
| 6,140,172 A | 10/2000 | Parekh |
| 6,143,476 A | 11/2000 | Ye et al. |
| 6,211,044 B1 | 4/2001 | Xiang et al. |
| 6,229,169 B1 | 5/2001 | Hofmann et al. |
| 6,282,113 B1 | 8/2001 | Debrosse |
| 6,288,454 B1 | 9/2001 | Allman et al. |
| 6,291,334 B1 | 9/2001 | Somekh |
| 6,297,554 B1 | 10/2001 | Lin |
| 6,335,257 B1 | 1/2002 | Tseng |
| 6,348,380 B1 | 2/2002 | Weimer et al. |
| 6,362,057 B1 | 3/2002 | Taylor et al. |
| 6,383,907 B1 | 5/2002 | Hasegawa et al. |
| 6,395,613 B1 | 5/2002 | Juengling |
| 6,404,056 B1 | 6/2002 | Kuge et al. |
| 6,423,474 B1 | 7/2002 | Holscher |
| 6,455,372 B1 | 9/2002 | Weimer |
| 6,468,887 B2 | 10/2002 | Iwasa et al. |
| 6,475,867 B1 | 11/2002 | Hui et al. |
| 6,500,763 B2 | 12/2002 | Kim et al. |
| 6,514,884 B2 | 2/2003 | Maeda |
| 6,522,584 B1 | 2/2003 | Chen et al. |
| 6,534,243 B1 | 3/2003 | Templeton |
| 6,548,396 B2 | 4/2003 | Naik et al. |
| 6,551,878 B2 | 4/2003 | Clampitt et al. |
| 6,558,756 B2 | 5/2003 | Sugahara et al. |
| 6,559,017 B1 | 5/2003 | Brown et al. |
| 6,566,280 B1 | 5/2003 | Meagley et al. |
| 6,573,030 B1 | 6/2003 | Fairbairn et al. |
| 6,597,203 B2 | 7/2003 | Forbes |
| 6,599,684 B2 | 7/2003 | Reynolds et al. |
| 6,602,779 B1 | 8/2003 | Li et al. |
| 6,627,933 B2 | 9/2003 | Juengling |
| 6,632,741 B1 | 10/2003 | Clevenger et al. |
| 6,638,441 B2 | 10/2003 | Chang et al. |
| 6,667,237 B1 | 12/2003 | Metzler |
| 6,673,684 B1 | 1/2004 | Huang et al. |
| 6,686,245 B1 | 2/2004 | Mathew et al. |
| 6,689,695 B1 | 2/2004 | Lui et al. |
| 6,693,324 B2 | 2/2004 | Maegawa et al. |
| 6,706,571 B1 | 3/2004 | Yu et al. |
| 6,707,092 B2 | 3/2004 | Sasaki |
| 6,709,807 B2 | 3/2004 | Hallock et al. |
| 6,713,392 B1 | 3/2004 | Ngo et al. |
| 6,734,063 B2 | 5/2004 | Willer et al. |
| 6,734,107 B2 | 5/2004 | Lai et al. |
| 6,737,333 B2 | 5/2004 | Chen et al. |
| 6,744,094 B2 | 6/2004 | Forbes |
| 6,756,284 B2 | 6/2004 | Sharma |
| 6,764,949 B2 | 7/2004 | Bonser et al. |
| 6,768,663 B2 | 7/2004 | Ogata |
| 6,773,998 B1 | 8/2004 | Fisher et al. |
| 6,777,725 B2 * | 8/2004 | Willer et al. ................ 257/244 |
| 6,794,699 B2 | 9/2004 | Bissey et al. |
| 6,800,930 B2 | 10/2004 | Jackson et al. |
| 6,835,662 B1 | 12/2004 | Erhardt et al. |
| 6,835,663 B2 | 12/2004 | Lipinski |
| 6,844,591 B1 | 1/2005 | Tran |
| 6,846,618 B2 | 1/2005 | Hsu et al. |
| 6,867,116 B1 | 3/2005 | Chung |
| 6,875,703 B1 | 4/2005 | Furukawa et al. |
| 6,881,627 B2 | 4/2005 | Forbes et al. |
| 6,888,187 B2 | 5/2005 | Brown et al. |
| 6,890,812 B2 | 5/2005 | Forbes et al. |
| 6,890,858 B2 | 5/2005 | Juengling et al. |
| 6,893,972 B2 | 5/2005 | Rottstegge et al. |
| 6,900,521 B2 | 5/2005 | Forbes et al. |
| 6,924,191 B2 | 8/2005 | Liu et al. |
| 6,936,507 B2 | 8/2005 | Tang et al. |
| 6,939,808 B2 | 9/2005 | Tzou et al. |
| 6,951,709 B2 | 10/2005 | Li |
| 6,962,867 B2 | 11/2005 | Jackson et al. |
| 7,005,240 B2 | 2/2006 | Manger et al. |
| 7,015,124 B1 | 3/2006 | Fisher et al. |
| 7,074,668 B1 | 7/2006 | Park et al. |
| 7,084,076 B2 | 8/2006 | Park et al. |
| 7,098,105 B2 | 8/2006 | Juengling |
| 7,105,431 B2 | 9/2006 | Yin et al. |
| 7,109,544 B2 | 9/2006 | Schloesser et al. |
| 7,115,525 B2 | 10/2006 | Abatchev et al. |
| 7,119,020 B2 | 10/2006 | Okamura et al. |
| 7,151,040 B2 | 12/2006 | Tran et al. |
| 7,183,597 B2 | 2/2007 | Doyle |
| 7,208,379 B2 | 4/2007 | Venugopal et al. |
| 7,288,445 B2 | 10/2007 | Bryant et al. |
| 7,291,560 B2 | 11/2007 | Parascandola et al. |
| 2002/0042198 A1 | 4/2002 | Bjarnason et al. |
| 2002/0045308 A1 | 4/2002 | Juengling |
| 2002/0063110 A1 | 5/2002 | Cantell et al. |
| 2002/0068243 A1 | 6/2002 | Hwang et al. |
| 2002/0127810 A1 | 9/2002 | Nakamura et al. |
| 2002/0130348 A1 | 9/2002 | Tran |
| 2002/0135029 A1 | 9/2002 | Ping et al. |
| 2002/0158273 A1 | 10/2002 | Satoh et al. |
| 2003/0006410 A1 | 1/2003 | Doyle |
| 2003/0044722 A1 | 3/2003 | Hsu et al. |
| 2003/0109102 A1 * | 6/2003 | Kujirai et al. ................ 438/243 |
| 2003/0119307 A1 | 6/2003 | Bekiaris et al. |
| 2003/0127426 A1 | 7/2003 | Chang et al. |
| 2003/0129001 A1 * | 7/2003 | Kisu et al. .................. 399/200 |
| 2003/0157436 A1 | 8/2003 | Manger et al. |
| 2003/0164513 A1 | 9/2003 | Ping et al. |
| 2003/0203564 A1 | 10/2003 | McQueen et al. |
| 2003/0207207 A1 | 11/2003 | Li |
| 2003/0207584 A1 | 11/2003 | Sivakumar et al. |
| 2003/0230234 A1 | 12/2003 | Nam et al. |
| 2003/0235076 A1 | 12/2003 | Forbes |
| 2004/0000534 A1 | 1/2004 | Lipinski |
| 2004/0017989 A1 | 1/2004 | So |
| 2004/0018738 A1 | 1/2004 | Liu |
| 2004/0023475 A1 | 2/2004 | Bonser et al. |
| 2004/0023502 A1 | 2/2004 | Tzou et al. |
| 2004/0041189 A1 | 3/2004 | Voshell et al. |
| 2004/0043623 A1 | 3/2004 | Liu et al. |
| 2004/0053475 A1 | 3/2004 | Sharma |
| 2004/0079988 A1 | 4/2004 | Harari |
| 2004/0106257 A1 | 6/2004 | Okamura et al. |
| 2004/0235255 A1 | 11/2004 | Tanaka |
| 2005/0074949 A1 | 4/2005 | Jung et al. |
| 2005/0079662 A1 * | 4/2005 | Miki .......................... 438/200 |
| 2005/0112886 A1 | 5/2005 | Asakawa et al. |
| 2005/0151206 A1 | 7/2005 | Schwerin |
| 2005/0153562 A1 | 7/2005 | Furukawa et al. |
| 2005/0164454 A1 | 7/2005 | Leslie |
| 2005/0167394 A1 | 8/2005 | Liu et al. |
| 2005/0186705 A1 | 8/2005 | Jackson et al. |

| | | | |
|---|---|---|---|
| 2005/0186746 A1* | 8/2005 | Lee et al. ............... 438/300 | |
| 2005/0202672 A1* | 9/2005 | Divakaruni et al. ......... 438/652 | |
| 2005/0207264 A1 | 9/2005 | Hsieh et al. | |
| 2005/0272259 A1 | 12/2005 | Hong | |
| 2006/0003182 A1 | 1/2006 | Lane et al. | |
| 2006/0022248 A1 | 2/2006 | Fischer et al. | |
| 2006/0024945 A1 | 2/2006 | Kim et al. | |
| 2006/0028859 A1 | 2/2006 | Forbes | |
| 2006/0046200 A1 | 3/2006 | Abatchev et al. | |
| 2006/0046201 A1 | 3/2006 | Sandhu et al. | |
| 2006/0046407 A1 | 3/2006 | Juengling | |
| 2006/0046422 A1 | 3/2006 | Tran et al. | |
| 2006/0046484 A1 | 3/2006 | Abatchev et al. | |
| 2006/0083996 A1 | 4/2006 | Kim | |
| 2006/0172540 A1 | 8/2006 | Marks et al. | |
| 2006/0211260 A1 | 9/2006 | Tran et al. | |
| 2006/0216293 A1 | 9/2006 | Couto et al. | |
| 2006/0216923 A1 | 9/2006 | Tran et al. | |
| 2006/0231900 A1 | 10/2006 | Lee et al. | |
| 2006/0263699 A1 | 11/2006 | Abatchev et al. | |
| 2006/0267075 A1 | 11/2006 | Sandhu et al. | |
| 2006/0273456 A1 | 12/2006 | Sant et al. | |
| 2006/0278911 A1 | 12/2006 | Eppich | |
| 2006/0281266 A1 | 12/2006 | Wells | |
| 2007/0026672 A1 | 2/2007 | Tang et al. | |
| 2007/0045712 A1 | 3/2007 | Haller et al. | |
| 2007/0048674 A1 | 3/2007 | Wells | |
| 2007/0049011 A1 | 3/2007 | Tran | |
| 2007/0049030 A1 | 3/2007 | Sandhu et al. | |
| 2007/0049032 A1 | 3/2007 | Abatchev et al. | |
| 2007/0049035 A1 | 3/2007 | Tran | |
| 2007/0049040 A1 | 3/2007 | Bai et al. | |
| 2007/0050748 A1 | 3/2007 | Juengling | |
| 2007/0145450 A1 | 6/2007 | Wang et al. | |
| 2007/0210449 A1 | 9/2007 | Caspary et al. | |
| 2007/0215960 A1 | 9/2007 | Zhu et al. | |
| 2007/0275309 A1 | 11/2007 | Liu | |

FOREIGN PATENT DOCUMENTS

| | | |
|---|---|---|
| DE | 42 36 609 A1 | 5/1994 |
| DE | 44 08 764 A1 | 9/1994 |
| DE | 199 28 781 C1 | 7/2000 |
| EP | 0 227 303 A2 | 7/1987 |
| EP | 0 491 408 A2 | 6/1992 |
| EP | 1 357 433 A2 | 10/2003 |
| GB | 2 404 083 | 1/2005 |
| JP | 05343370 | 12/1993 |
| JP | H8-55908 | 2/1996 |
| JP | H8-55920 | 2/1996 |
| WO | WO 94/15261 | 7/1994 |
| WO | WO 01/01489 A1 | 1/2001 |
| WO | WO 02/099864 A1 | 12/2002 |
| WO | WO 04/001799 A2 | 12/2003 |
| WO | WO 2004/003977 | 1/2004 |
| WO | WO 2004/073044 A2 | 8/2004 |
| WO | WO 2005/010973 A1 | 2/2005 |
| WO | WO 2005/034215 A1 | 4/2005 |
| WO | WO 2005/119741 A3 | 12/2005 |
| WO | WO 2006/026699 A2 | 3/2006 |

OTHER PUBLICATIONS

Bhave et al., "Developer-soluble Gap fill materials for patterning metal trenches in Via-first Dual Damascene process," preprint of Proceedings of SPIE: Advances in Resist Technology and Processing XXI, vol. 5376, John L. Sturtevant, editor, 2004, 8 pages.

Chung et al., "Pattern multiplication method and the uniformity of nanoscale multiple lines," J.Vac.Sci. Technol. B21(4), Jul./Aug. 2003, pp. 1491-1495.

Chung et al., "Nanoscale Multi-Line Patterning Using Sidewall Structure," Jpn. J. App.. Phys., vol. 41, Pt. 1, No. 6B, 2002, pp. 4410-4414.

Joubert et al, "Nanometer scale linewidth control during etching of polysilicon gates in high-density plasmas," Microelectronic Engineering 69, 2003, pp. 350-357.

Oehrlein et al., "Pattern transfer into low dialectic materials by high-density plasma etching," Solid State Tech., May 2000, 8 pages.

Sakao M. et al., "A Straight-Line-Trench Isolation and Trench-Gate Transistor (SLIT) Cell for Giga-bit DRAMs," Proceedings of IEEE VLSI Technology Symposium May 17-19, 1993 Kyoto, Japan, pp. 19-20.

Schloesser et al., "Highly Scalable Sub-50nm Vertical Double Gate Trench DRAM Cell," Memory Development Center, Infineon Tech., 2004, 4 pages.

Yan R-H et al., "Scaling the Si MOSFET: From Bulk to SOI to Bulk," IEEE Transactions on Electron Devices USA; vol. 39, No. 7, Jul. 1992, pp. 1704-1710.

U.S. Appl. No. 11/219,349, Haller et al., filed Sep. 1, 2005.
U.S. Appl. No. 11/216,613, Juengling, filed Aug. 30, 2005.
U.S. Appl. No. 11/215,982, Tran, filed Aug. 31, 2005.
U.S. Appl. No. 11/217,270, Wells, filed Sep. 1, 2005.
U.S. Appl. No. 11/192,828, Tang et al., filed Jul. 29, 2005.
U.S. Appl. No. 11/219,346, Sandhu et al., filed Sep. 1, 2005.
U.S. Appl. No. 11/219,067, Tran, filed Sep. 1, 2005.
U.S. Appl. No. 11/219,604, Abatchev et al., filed Sep. 1, 2005.
B. Lim, Nature vol. 2, Nov. 2003 pp. 749-753.
"U.S. Appl. No. 11/543,515, filed Oct. 24, 2006".
"Ex parte Cantell, unpublished decision of the Board of Patent Appeals and Interferences, Mar. 4, 2005".

Choi et al., "Sublithographic nanofabrication technology for nanocatalysts and DNA chips," *J.Vac. Sci. Technol.*, Nov./Dec. 2003; pp. 2951-2955.

Office Action received in U.S. Appl. No. 11/490,294, dated Jan. 24, 2008.

Office Action received in U.S. Appl. No. 11/366,212, dated Feb. 26, 2008.

International Preliminary Report on Patentability dated May 28, 2008, Application No. PCT/US2007/005305.

International Search Report and Written Opinion dated Sep. 10, 2007, Application No. PCT/US2007/005305.

Bruek, S.R.J., "Optical and interferometric lithography—Nanotechnology enablers," *Proceedings of the IEEE*, vol. 93, No. 10, Oct. 2005, pp. 1704-1721.

Sheats et al., "Microlithography: Science and Technology," *Marcel Dekkar, Inc.*, pp. 104-105 (1998).

U.S. Office Action issued Jun. 2, 2008 in U.S. Appl. No. 11/219,067, filed Sep. 1, 2005.

U.S. Office Action issued Jun. 5, 2008 in U.S. Appl. No. 11/514,117, filed Aug. 30, 2006.

U.S. Office Action issued Jul. 11, 2008 in U.S. Appl. No. 11/367,020, filed Mar. 2, 2006.

* cited by examiner

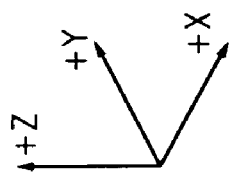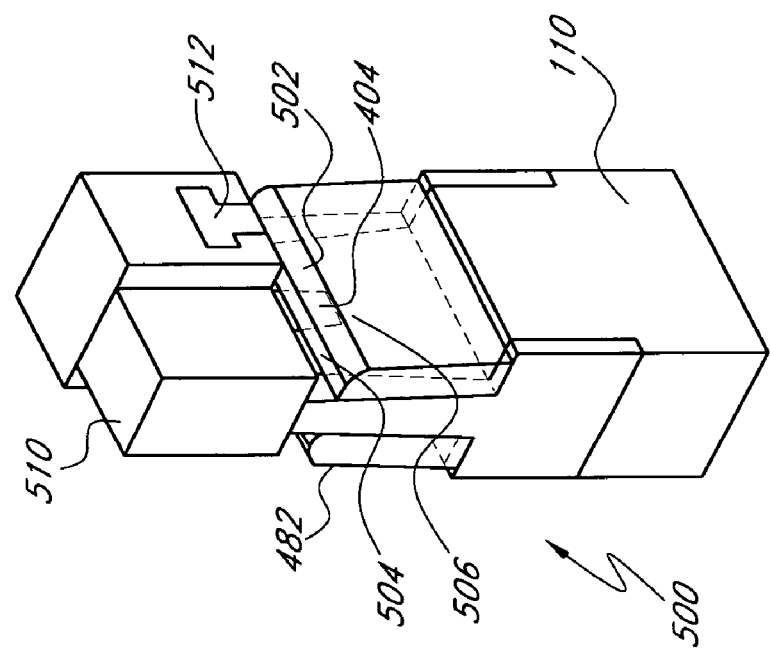
FIG. 23

MASKING PROCESS FOR SIMULTANEOUSLY PATTERNING SEPARATE REGIONS

RELATED APPLICATIONS

This application is related to U.S. patent application Ser. No. 10/933,062, filed 1 Sep. 2004, now U.S. Pat. No. 7,442,976, U.S. patent application Ser. No. 10/934,778, filed 2 Sep. 2004, now U.S. Pat. No. 7,115,525, U.S. patent application Ser. No. 10/855,429, filed 26 May 2004, now U.S. Pat. No. 7,098,105, U.S. patent application Ser. No. 11/201,824, filed 10 Aug. 2005, now U.S. Pat. No. 7,391,070, and U.S. patent application Ser. No. 11/366,212, filed concurrently with this application, now U.S. Pat. No. 7,476,933. The entire disclosure of each of these related applications is hereby incorporated by reference herein.

FIELD OF THE INVENTION

The present invention relates generally to methods for forming semiconductor structures, and relates more specifically to improved methods for forming vertical transistor devices.

BACKGROUND OF THE INVENTION

One way that integrated circuit designers make faster and smaller integrated circuits is by reducing the separation distance between the individual elements that comprise the integrated circuit. This process of increasing the density of circuit elements across a substrate is typically referred to as increasing the level of device integration. In the process of designing integrated circuits with higher levels of integration, improved device constructions and fabrication methods have been developed.

An example of a common integrated circuit element is a transistor. Transistors are used in many different types of integrated circuits, including memory devices and processors. A typical transistor comprises a source, a drain, and a gate formed at the substrate surface. Recently, vertical transistor constructions that consume less substrate "real estate", and thus that facilitate increasing the level of device integration, have been developed. Examples of vertical transistor constructions are disclosed in U.S. patent application Ser. No. 10/933,062 (filed 1 Sep. 2004), the entire disclosure of which is hereby incorporated by reference herein. While these improved transistor constructions are smaller and are packed more densely, they also often involve fabrication processes that are significantly more complex, therefore increasing fabrication time and expense. Fabrication complexity is increased even further when high density vertical transistors are formed in an array on the same substrate as logic circuitry that is positioned adjacent to the transistor array. In particular, conventional fabrication techniques use separate masks to independently define features in the device array region and in the device periphery region, since different process steps and materials are used to define the devices of these two regions.

Conventional semiconductor-based electronic storage devices, such as dynamic random access memory ("DRAM") devices, include large numbers of transistor and capacitor elements that are grouped into memory cells. The memory cells that comprise a DRAM device are arranged into larger memory arrays that often comprise thousands, if not millions, of individual memory cells. Therefore, there is a continuing effort to reduce the complexity of the processes used to form densely-packed integrated circuit elements such as vertical transistor constructions.

BRIEF SUMMARY OF THE INVENTION

According to one embodiment of the present invention, a method of forming an array of memory devices comprises forming a plurality of deep trenches and a plurality of shallow trenches in a first region of a substrate. At least one of the shallow trenches is positioned between two deep trenches. The plurality of shallow trenches and the plurality of deep trenches are parallel to each other. The method further comprises depositing a layer of conductive material over the first region and a second region of the substrate. The method further comprises etching the layer of conductive material to define a plurality of lines separated by a plurality of gaps over the first region of the substrate, and a plurality of active device elements over the second region of the substrate. The method further comprises masking the second region of the substrate. The method further comprises removing the plurality of lines from the first region of the substrate, thereby creating a plurality of exposed areas from which the plurality of lines were removed. The method further comprises etching a plurality of elongate trenches in the plurality of exposed areas while the second region of the substrate is masked.

According to another embodiment of the present invention, an apparatus comprises a semiconductor substrate having an array portion and a logic portion. The apparatus further comprises at least one U-shaped semiconductor structure formed in the substrate array portion. The semiconductor structure comprises a first source/drain region positioned atop a first pillar, a second source/drain region positioned atop a second pillar, and a U-shaped channel connecting the first and second source/drain regions. The U-shaped channel is contiguous with the semiconductor substrate. The method further comprises at least one transistor device formed over the substrate logic portion, the transistor device including a gate dielectric layer and a gate material. The gate dielectric layer is elevated with respect to the first and second source/drain regions.

According to another embodiment of the present invention, a memory device comprises a substrate having an array portion and a logic portion. The memory device further comprises a plurality of U-shaped semiconductor structures that are formed in the array portion of the substrate. The U-shaped semiconductor structures are defined by a pattern of alternating deep and shallow trenches that are crossed by a pattern of intermediate-depth trenches. The memory device further comprises a plurality of transistor devices formed over the logic portion of the substrate. The transistor devices include a gate oxide layer, an uncapped gate layer, and a sidewall spacer structure.

According to another embodiment of the present invention, a method comprises patterning a plurality of shallow trenches and a plurality of deep trenches in a substrate array region. The method further comprises patterning a plurality of intermediate-depth trenches in the substrate array region. The intermediate-depth trenches cross the shallow and deep trenches. The intermediate-depth, shallow and deep trenches define a plurality of U-shaped transistor structures in the substrate array region. The plurality of intermediate-depth trenches are defined by a photolithography mask. The method further comprises patterning a plurality of planar transistor structures in a substrate logic region. The plurality of planar transistor structures are defined by the photolithography mask.

According to another embodiment of the present invention, a method comprises patterning a first plurality of semiconductor structures in an array portion of a semiconductor substrate using a first photolithographic mask. The method further comprises patterning a second plurality of semiconductor structures over a logic portion of a semiconductor substrate using a second photolithographic mask. The method further comprises patterning a sacrificial layer over the first plurality of semiconductor structures using the second photolithographic mask. The sacrificial layer is patterned simultaneously with the second plurality of semiconductor structures.

According to another embodiment of the present invention, a method comprises providing a semiconductor substrate having a first region and a second region. The method further comprises depositing a conductive layer over the substrate first and second regions. The method further comprises patterning the conductive layer deposited over the substrate first and second regions. The method further comprises using the patterned conductive layer to form a planar transistor structure over the substrate second region. The method further comprises using the patterned conductive layer in a masking process in the substrate first region.

According to another embodiment of the present invention, a partially-formed integrated circuit comprises a first plurality of features comprising a first material and formed over a first portion of a substrate. The first plurality of features are separated from each other by a first spacing. The partially-formed integrated circuit further comprises a second plurality of features comprising a second material and formed over a second portion of the substrate. The first plurality of features and the second plurality of features are formed simultaneously. The first material is the same as the second material. The partially-formed integrated circuit further comprises a gap fill structure positioned between and contacting a selected two of the first plurality of features. The partially-formed integrated circuit further comprises a plurality of sidewall spacers positioned adjacent the second plurality of features. Adjacent sidewall spacers are separated from each other by a separation region. The plurality of sidewall spacers and the gap fill structure comprise the same material.

According to another embodiment of the present invention, a memory device comprises a substrate having an array portion and a logic portion. The memory device further comprises a plurality of semiconductor structures that are recessed in the array portion of the substrate. The memory device further comprises a plurality of transistor devices formed over the logic portion of the substrate. The transistor devices include a gate oxide layer, an uncapped gate layer, and a sidewall spacer structure. The transistor devices are formed in a layer that is below the plurality of semiconductor structures.

BRIEF DESCRIPTION OF THE DRAWINGS

Exemplary embodiments of the transistor constructions disclosed herein are illustrated in the accompanying drawings, which are for illustrative purposes only. The drawings comprise the following figures, in which like numerals indicate like parts.

FIG. 23 illustrates a perspective view of one transistor comprising the partially-formed semiconductor device of FIG. 22, including an overlying capacitor and bit line.

DETAILED DESCRIPTION OF THE INVENTION

Disclosed herein are improved fabrication techniques for vertical transistor constructions. As disclosed above, vertical transistor constructions advantageously enable increased levels of device integration. The fabrication techniques disclosed herein advantageously use (a) fewer masking processes as compared to conventional fabrication techniques, and/or (b) masking processes that are easier to align. For example, certain of the embodiments disclosed herein advantageously enable the forming of active devices in the periphery region and patterning features (for example, intermediate trenches separating rows of transistors) in the array region with a single mask. Additionally, certain embodiments of the vertical transistors disclosed herein have a U-shaped configuration, wherein the channel connecting the source and drain regions is directly connected to the underlying substrate. This advantageously reduces or eliminates the floating body effect that is common in conventional vertical pillar transistors.

The U-shaped vertical transistor configurations disclosed herein provide several advantages over conventional planar transistors. In addition to consuming less substrate "real estate", certain of the U-shaped vertical transistor configurations disclosed herein form continuous rows and columns during fabrication, thereby enhancing the structural stability of the device. Certain embodiments of the fabrication techniques disclosed herein also advantageously allow use of a simplified reticle set to perform the masking processes employed to fabricate the memory array. Specifically, one embodiment of the reticle set used to fabricate such an array contains parallel lines and spaces, thereby facilitating printing and alignment of the masking processes.

The techniques disclosed herein are usable to form transistor structures with a wide variety of different dimensions. In certain embodiments, pitch doubling techniques are used to form relatively smaller devices in an array region, and conventional photolithography techniques are used to form relatively larger devices in a periphery region. For example, in one embodiment structures having a feature size between ½ F and ¾ F are formed in the array region, while structures having a feature size of F or larger are formed in the periphery region, wherein F is the minimum resolvable feature size obtainable using a given photolithography technique. Additional information regarding pitch doubling techniques are provided in U.S. patent application Ser. No. 10/934,778 (filed 2 Sep. 2004), the entire disclosure of which is hereby incorporated by reference herein.

Figure 1:
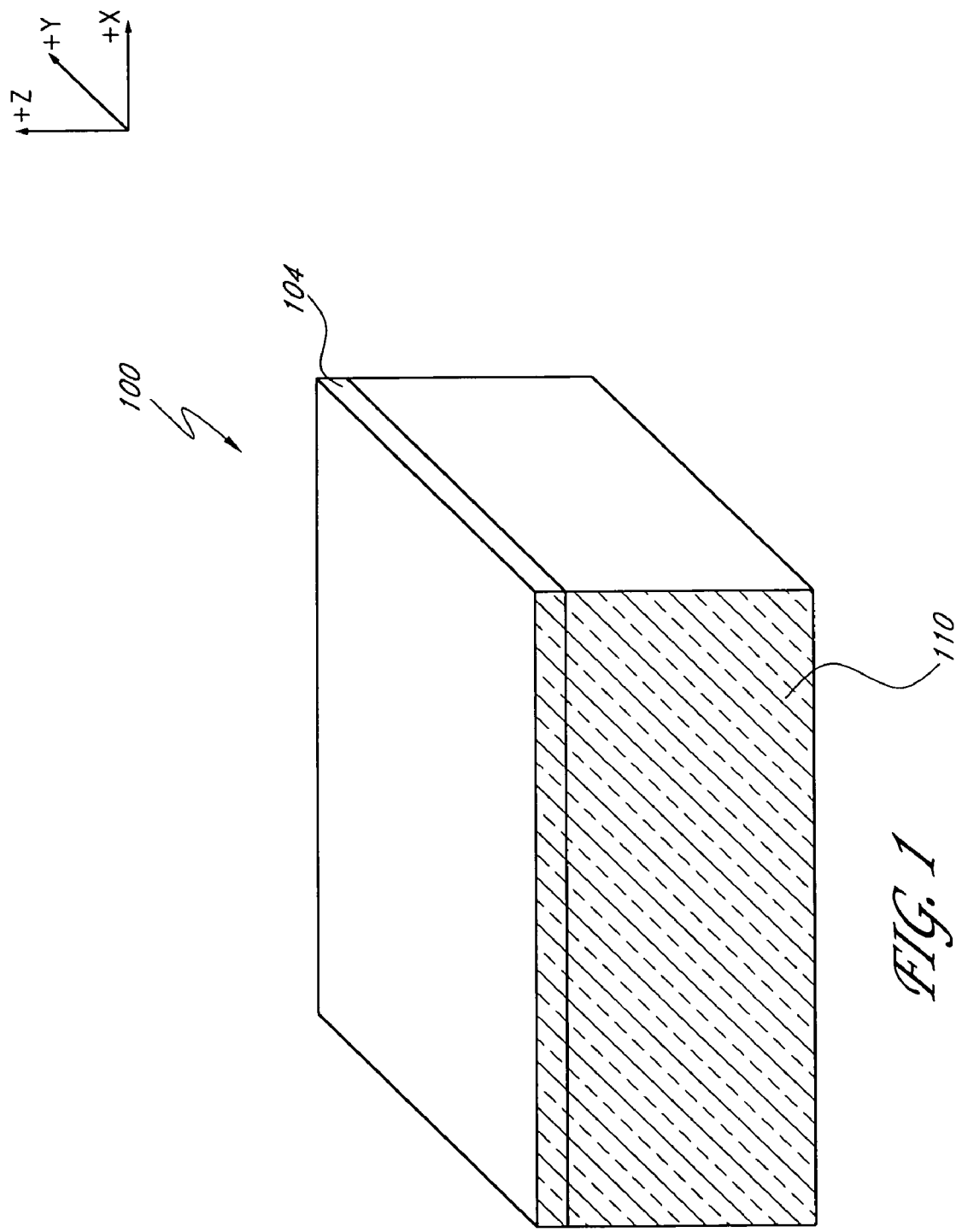
FIG. 1 illustrates a perspective view of a partially-formed semiconductor device usable to form an array of transistors.

FIG. 1 is a perspective view of a partially formed semiconductor device 100 in which a transistor array is to be formed. In one embodiment, the device 100 comprises a memory array, such as an array of DRAM cells, although in other embodiments the device 100 comprises an array of other types of memory cells, such as static memory cells, dynamic memory cells, extended data out ("EDO") memory cells, EDO DRAM, electrically erasable programmable read only memory ("EEPROM") cells, synchronous dynamic random access memory ("SDRAM") cells, double data rate ("DDR") SDRAM cells, synchronous link dynamic random access memory ("SLDRAM") cells, video dynamic random access memory ("VDRAM") cells, RDRAM® cells, static random access memory ("SRAM") cells, phase change or programmable conductor random access memory ("PCRAM") cells, magnetic random access memory ("MRAM") cells, and flash memory cells.

The device 100 includes a semiconductor substrate 110, which comprises one or more of a wide variety of suitable semiconductor materials. In modified embodiments, the semiconductor substrate 110 includes semiconductor structures that have been fabricated thereon, such as doped silicon platforms. While the illustrated semiconductor substrate 110 comprises an intrinsically doped monocrystalline silicon wafer in the illustrated embodiment, in other embodiments the semiconductor substrate 110 comprises other forms of semiconductor layers, which optionally include other active or operable portions of semiconductor devices.

Optionally, an epitaxial layer 104 is grown on the substrate 110. The epitaxial layer 104 is a semiconductor layer (for example, comprising silicon) grown on the substrate 110 by an epitaxial growth process that extends the crystal structure of the substrate 110. The epitaxial layer 104 has a thickness that is preferably between about 2 μm and about 6 μm, and more preferably between about 3 μm and about 5 μm. In embodiments wherein the epitaxial layer 104 is grown on the substrate 110 before the subsequent etching steps described herein, the epitaxial layer 104 is considered part of the substrate 110.

In certain embodiments, the epitaxial layer 104 is heavily doped with a conductivity type that is opposite that of the substrate 110, thereby enabling the epitaxial layer 104 to serve as an active area for transistors formed thereover, as will be better understood from the final structures disclosed herein. In one configuration, the doped implant regions include a lightly doped $p^-$ region that is positioned underneath a heavily doped $p^+$ region.

Figure 2:
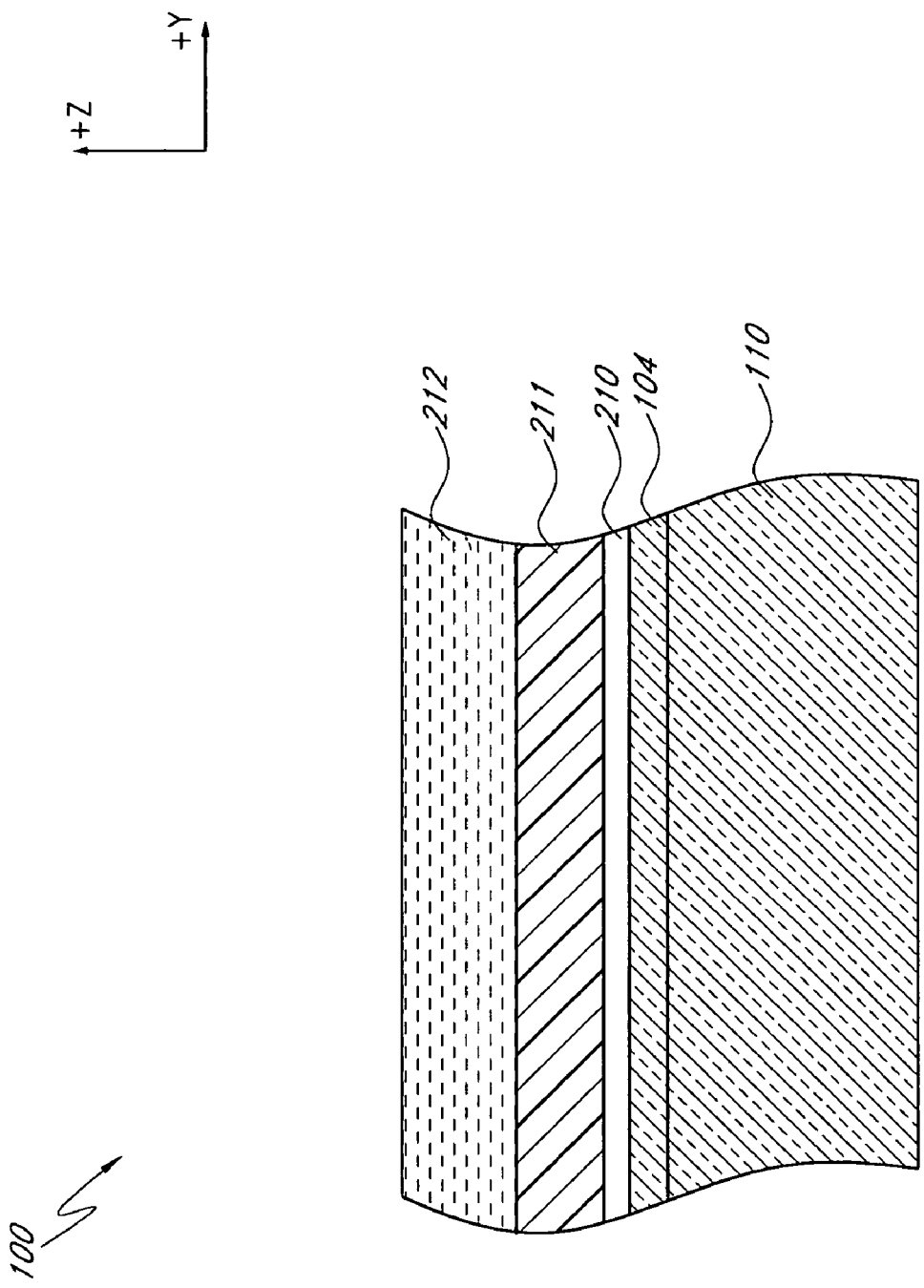
FIG. 2 illustrates a cross-sectional view in the yz plane of the partially-formed semiconductor device of FIG. 1, after the formation of additional semiconductor processing layers.

FIG. 2 illustrates a cross-section in the yz plane of the device of FIG. 1 after deposition of additional layers over the substrate 110. As illustrated, the semiconductor device 100 further comprises an oxide layer 210 formed over the substrate 110 and the optional epitaxial layer 104. In an exemplary embodiment, the oxide layer 210 is selectively etchable with respect to the material comprising the substrate 110 and silicon nitride. In one embodiment, the oxide layer 210 comprises silicon dioxide and has a thickness that is preferably between about 100 Å and 500 Å, and more preferably between about 200 Å and about 300 Å. For example, in one embodiment, the oxide layer 210 is a pad oxide layer having a thickness of approximately 200 Å. The oxide layer 210 is deposited using a suitable deposition process, such as chemical vapor deposition ("CVD") or physical vapor deposition ("PVD"), or is grown by oxidation of the underlying substrate.

Still referring to FIG. 2, the semiconductor device 100 further comprises a layer, such as the illustrated nitride layer 211, formed over the oxide layer 210. In one embodiment, the nitride layer 211 comprises silicon nitride and has a thickness that is preferably between about 200 Å and 2000 Å, and more preferably between about 500 Å and 1000 Å. The nitride layer 211 is deposited using a suitable deposition process, such as CVD or PVD.

The semiconductor device 100 further comprises a further hard mask layer 212 that is formed over the nitride layer 211. In an exemplary embodiment, the hard mask layer 212 comprises amorphous carbon. In other embodiments, the hard mask layer 212 comprises transparent carbon, tetraethylorthosilicate ("TEOS"), polycrystalline silicon, $Si_3N_4$, $SiO_xN_y$, SiC, or another suitable hard mask material. The hard mask layer 212 is deposited using a suitable deposition process, such as CVD or PVD. For purposes of clarity, the optional epitaxial layer 104 is omitted from subsequent illustrations.

Figure 3:
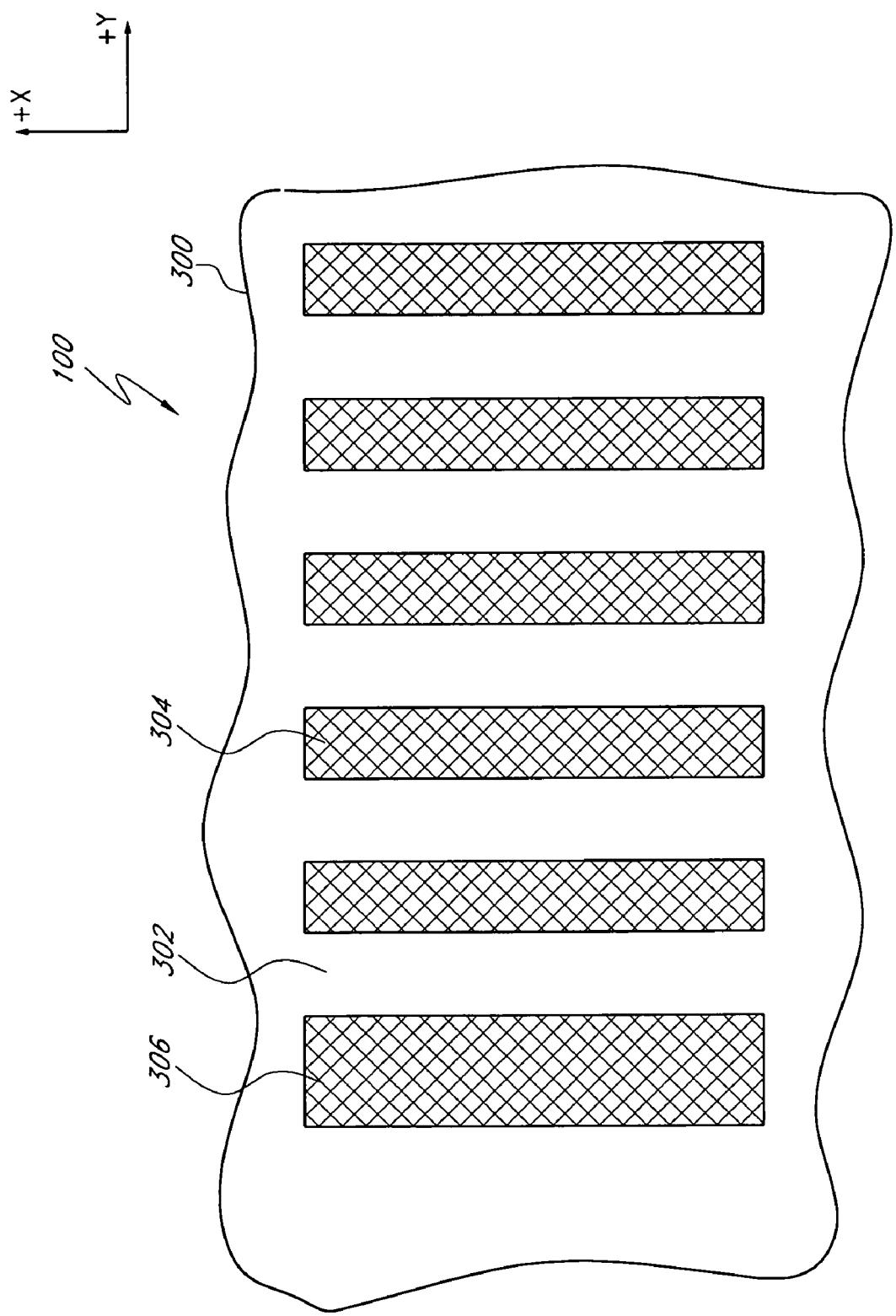
FIG. 3 illustrates a partial top plan view of an exemplary embodiment of a photo mask to be applied to the partially-formed semiconductor device of FIG. 1.

FIG. 3 illustrates a portion of a photo mask 300 to be applied to the device 100 to pattern the underlying hard mask layer 212. The shaded portion of the photo mask 300 represents the area in which the hard mask layer 212 will be removed after applying photolithography and etching techniques, and the unshaded portion represents the area in which the hard mask layer 212 will remain. The photo mask 300 is a clear field mask that is configured to define a pattern of active area lines 304 separated from each other by gaps 302 in an array region 308. Preferably, the lines 304 and the gaps 302 are approximately 1100 Å to approximately 1300 Å wide. For example, in an exemplary embodiment the lines 304 and the gaps 302 are approximately 1200 Å wide. The photo mask 300 optionally includes a wider line 306 that is provided for optical proximity correction. The gaps 302 are used as a contact area for shallow trench isolation.

Figure 4:
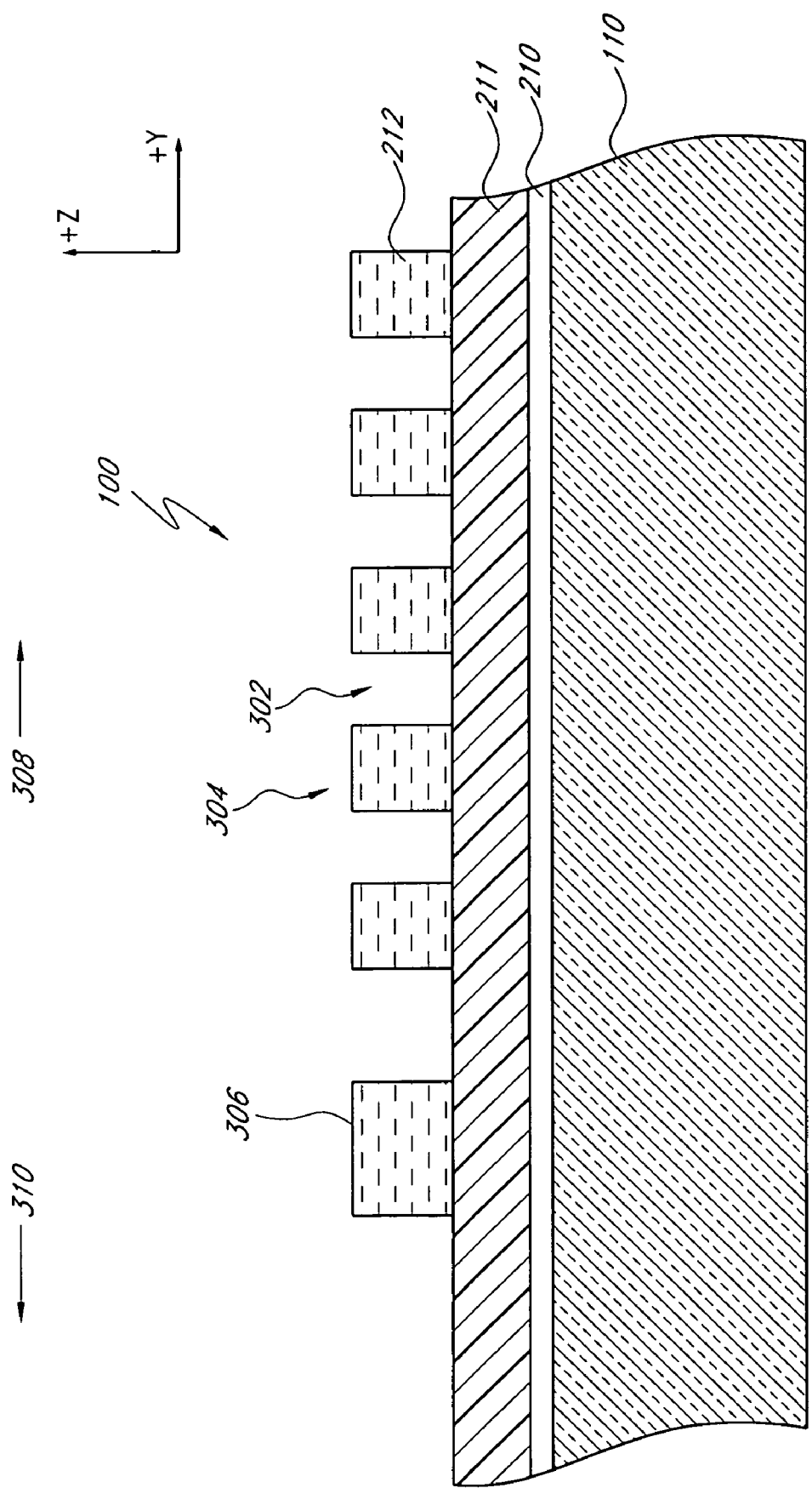
FIG. 4 illustrates a cross-sectional view in the yz plane of the partially-formed semiconductor device of FIG. 2 after the photo mask of FIG. 3 has been applied and transferred to pattern the hard mask layer.

FIG. 4 illustrates a cross-section in the yz plane of the device of FIG. 2 after applying the photo mask 300, illustrated in FIG. 3, to pattern the hard mask layer 212. The photo mask 300 is applied and transferred to the hard mask layer 212, such that the lines 304 and gaps 302 extend parallel to the x axis. As illustrated in FIG. 4, the hard mask layer 212 remains over areas of the substrate 110 where the photo mask 300 forms lines 304, including the wider line 306, and is removed form areas of the substrate 110 where the photo mask 300 forms gaps 302. As illustrated in FIG. 4, lines 304 and gaps 302 are located in an array region 308 of the device, which is surrounded by a periphery region 310 of the device.

In an exemplary embodiment, the hard mask layer 212 is patterned using photolithography and etching techniques. For example, in one embodiment photoresist material is deposited as a blanket layer over the device 100, and is exposed to radiation through a reticle. Following this exposure, the photoresist material is developed to form the photo mask 300, illustrated in FIG. 3, on the surface of the hard mask layer 212. The hard mask layer 212 is then etched through the photo mask 300 to expose the nitride layer 211 of the device 100 in the gaps 302.

Figure 5:
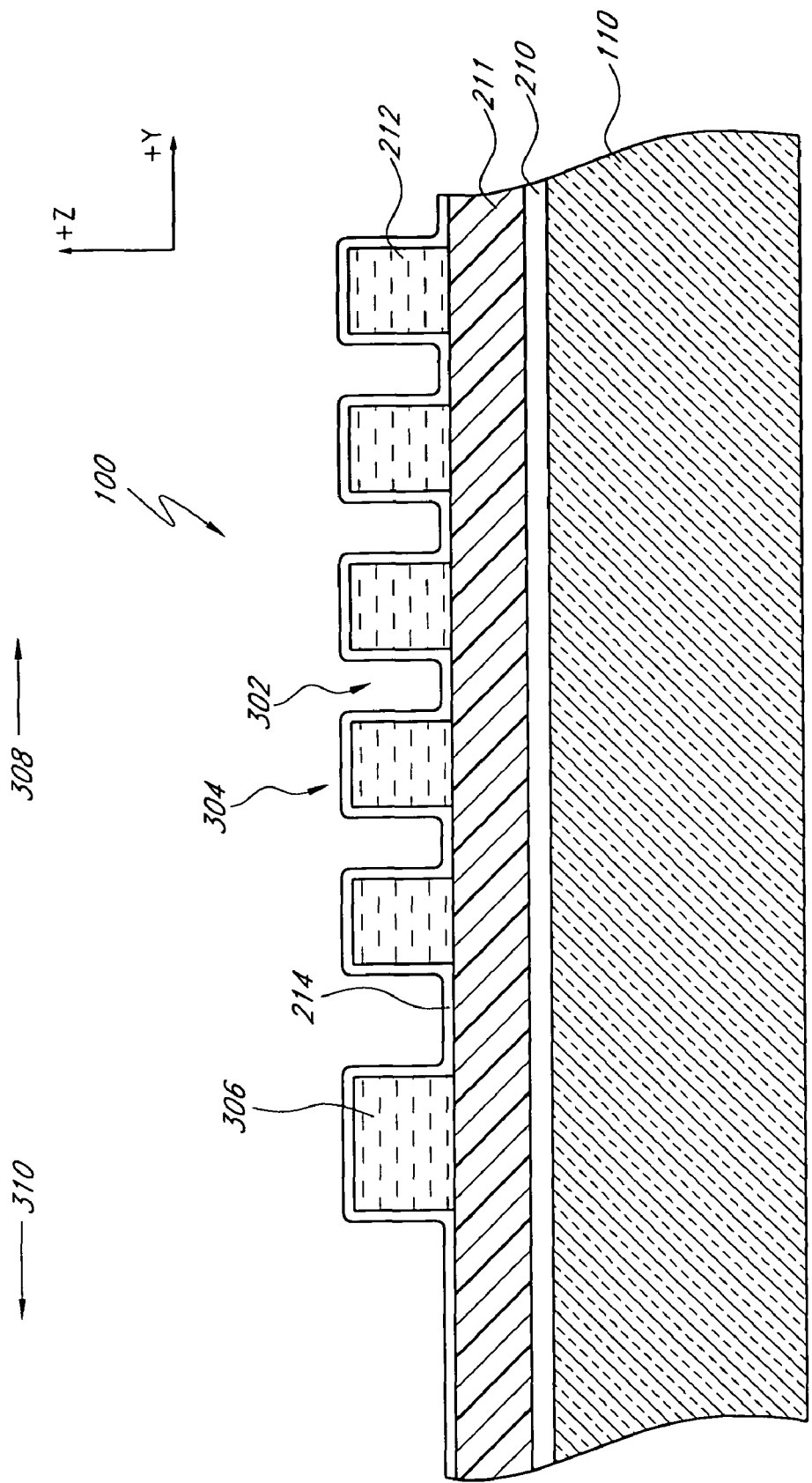
FIG. 5 illustrates a cross-sectional view in the yz plane of the partially-formed semiconductor device of FIG. 4 after blanket depositing a layer of spacer material thereover.

FIG. 5 illustrates a cross-section in the yz plane of the device of FIG. 4 after blanket depositing a layer of spacer material 214 thereover. In an exemplary embodiment, the spacer material 214 comprises an oxide material, such as silicon oxide having a thickness that is preferably between about 200 Å and about 500 Å, and more preferably between about 300 Å and about 400 Å. In another embodiment, the spacer material 214 fills approximately 1/20 to approximately 1/3 of the horizontal dimension of the gaps 302. The spacer material 214 is deposited using a suitable deposition process, such as CVD or PVD.

Figure 6:
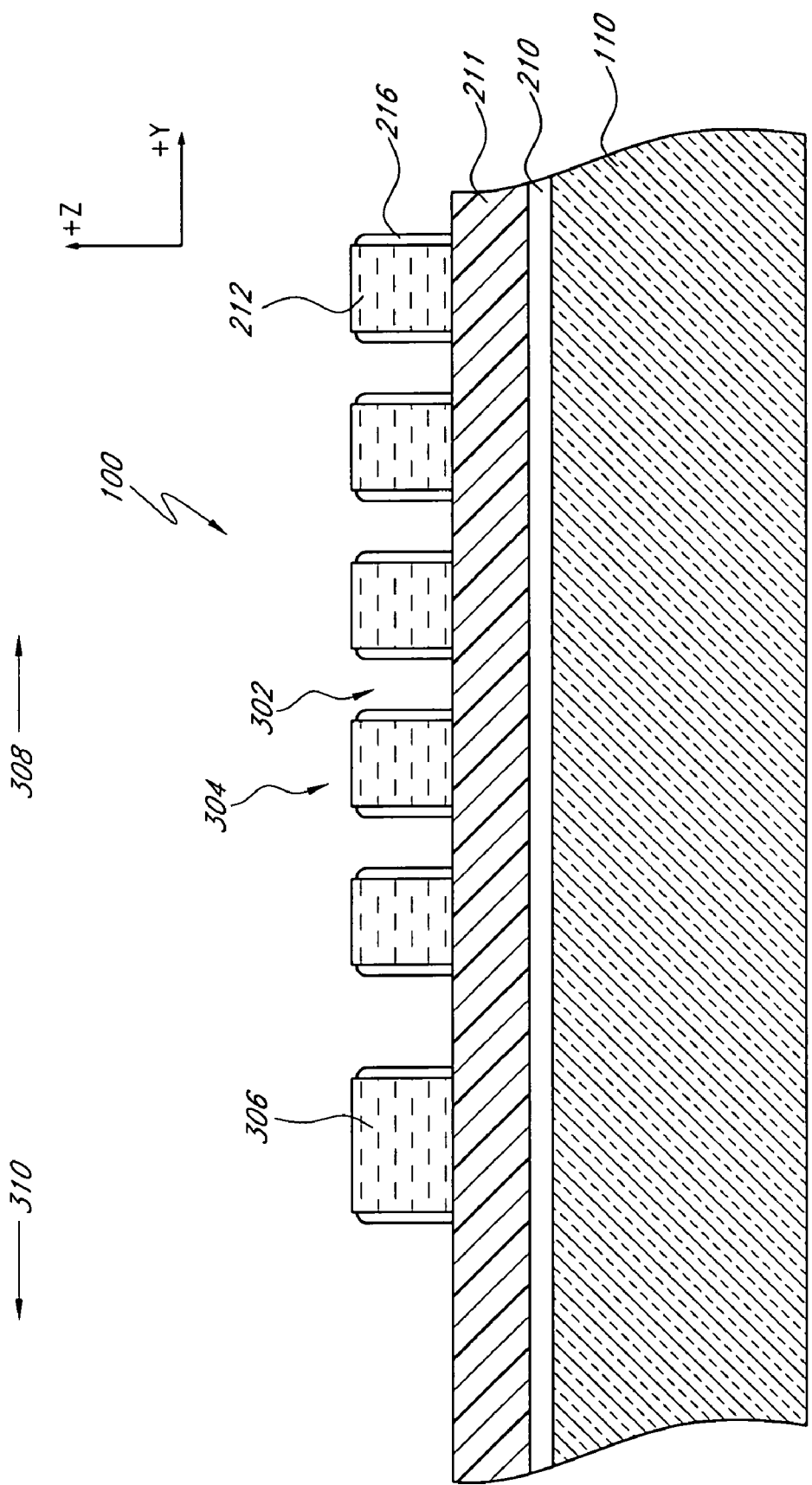
FIG. 6 illustrates a cross-sectional view in the yz plane of the partially-formed semiconductor device of FIG. 5 after performing a directional etch of the spacer material.

FIG. 6 illustrates a cross-section in the yz plane of the device of FIG. 5 after preferentially etching the spacer material 214 from horizontal surfaces in a directional spacer etch. The resulting structure includes spacers 216 positioned on the vertical sides of the lines 304. The spacers 216, which have a width approximately equal to the thickness of the original spacer material 214 deposition, effectively narrow the width of the gaps 302. Preferably, the gaps 302 have a reduced width of between about 500 Å and about 700 Å after the spacers 216 are formed therein. In an exemplary embodiment, the gaps 302 have a reduced width of about 600 Å after the spacers 216 are formed therein.

Figure 7:
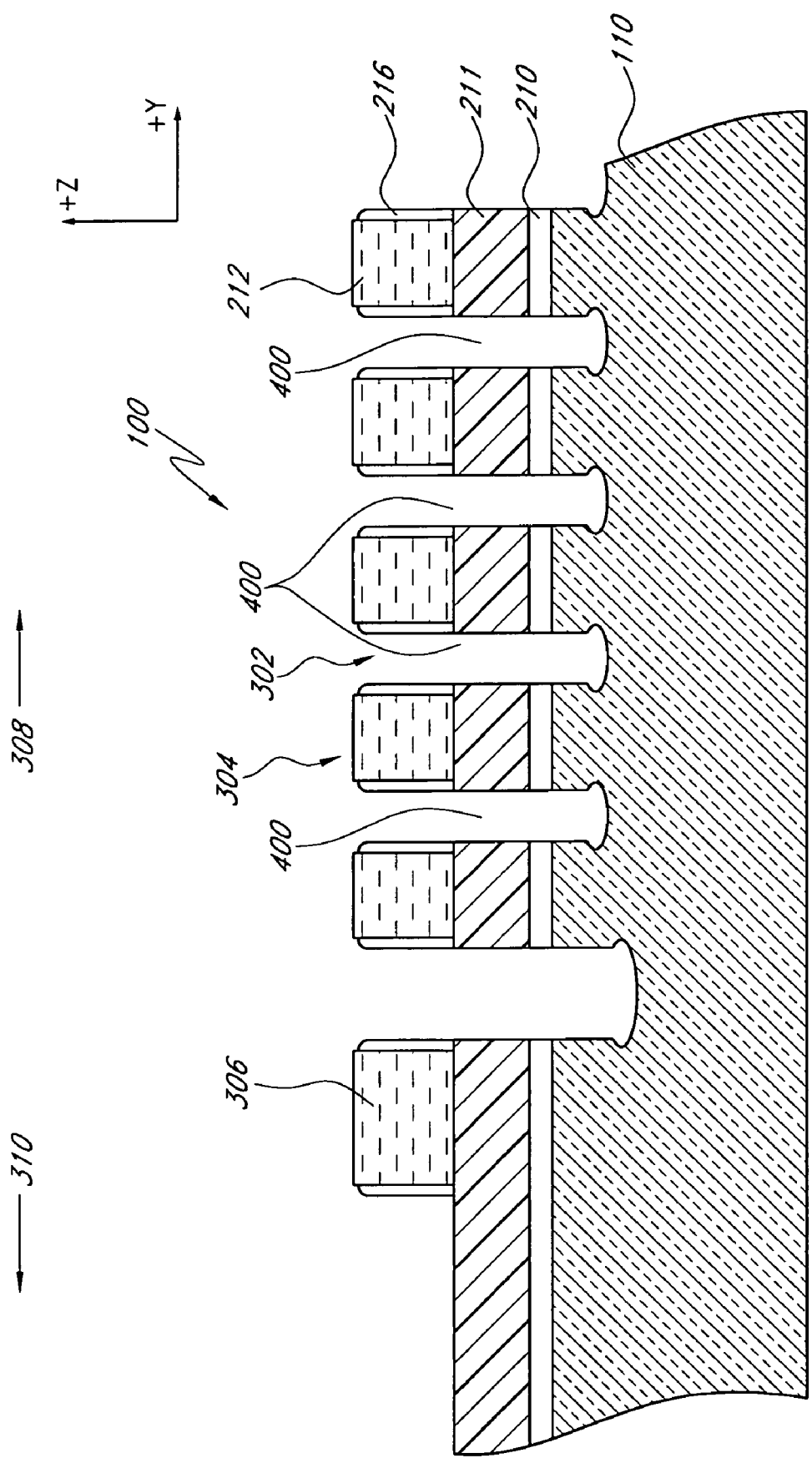
FIG. 7 illustrates a cross-sectional view in the yz plane of the partially-formed semiconductor device of FIG. 6 after etching a plurality of deep trenches into the substrate.

FIG. 7 illustrates a cross-section in the yz plane of the device of FIG. 6 after etching a plurality of deep trenches 400 through the nitride layer 211 and the oxide layer 210, and into the substrate 110. The pattern of deep trenches 400 is defined according to the gaps 302 between the spacers in the device array region 308. The deep trenches 400 are etched using a process such as ion milling, reactive ion etching ("RIE"), or chemical etching. RIE is a directional anisotropic etch having both physical and chemical components. In an etching process using a chemical etchant, such as RIE, a variety of etchants are usable, such as $Cl_2$. In a preferred embodiment, the deep trenches 400 are etched to a depth of between about 3000 Å and about 5000 Å based on gaps 302, and are etched to a depth of between about 4000 Å and about 5000 Å adjacent to the wider line 306. Thus, in an example embodiment the etching technique used to define the deep trenches causes the trench depth to be directly proportional to the trench width.

Figure 8:
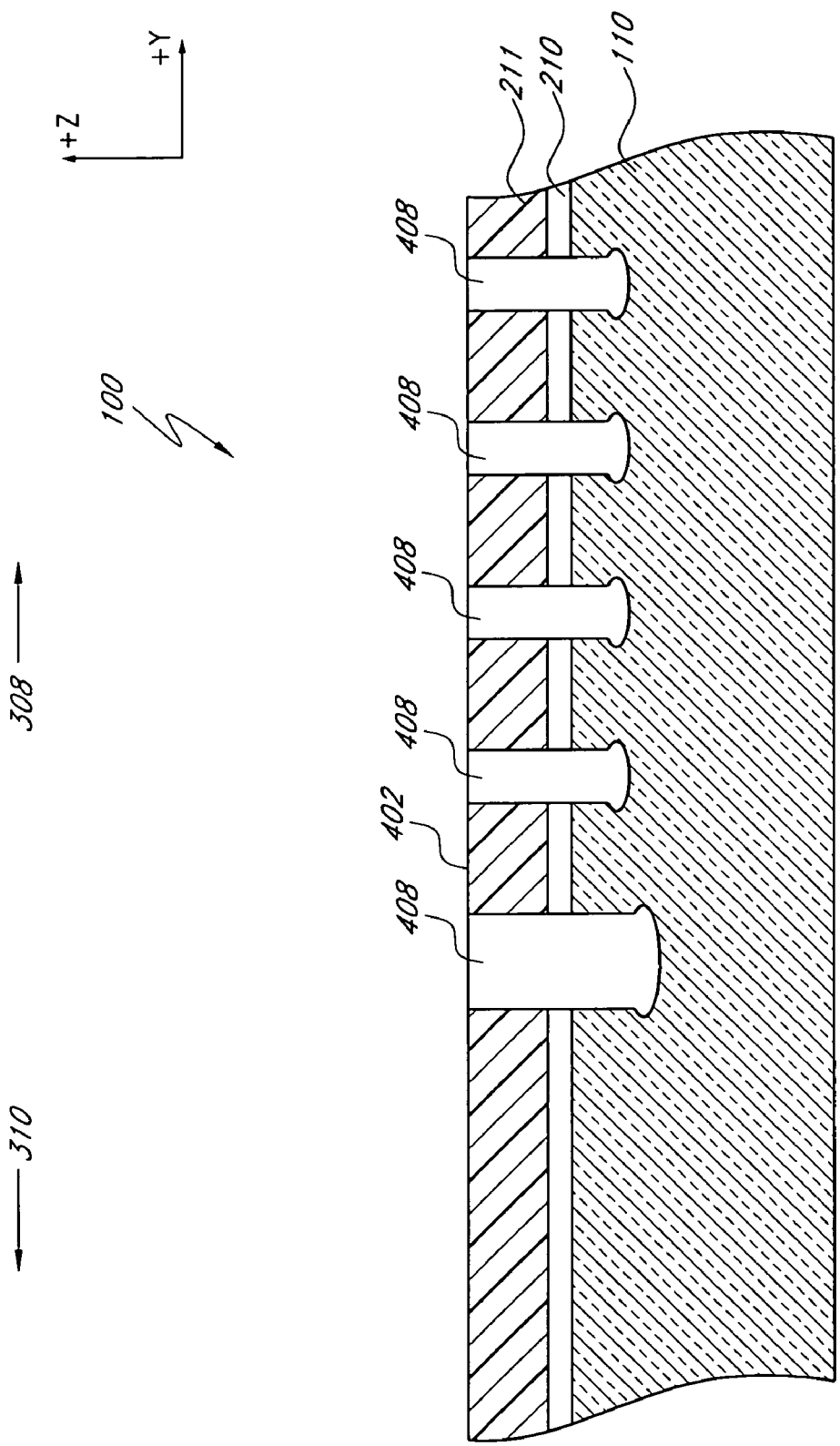
FIG. 8 illustrates a cross-sectional view in the yz plane of the partially-formed semiconductor device of FIG. 7 after filling the deep trenches with a dielectric material and providing the device with a substantially planar surface.

FIG. 8 illustrates a cross-section in the yz plane of the device of FIG. 7 after filling the deep trenches 400 with a spin on dielectric ("SOD") material 408. An oxygen plasma technique is used to burn off the remaining hard mask layer 212, and a chemical mechanical polish ("CMP") technique is used to remove the remaining spacers 216 and excess SOD material. The CMP technique also provides the device 100 with a substantially planar surface 402 in the xy plane. As illustrated, the substantially planar surface 402 extends across the device array region 308 and periphery region 310. The deep trenches 400 are separated by remaining portions of the nitride layer 211; in a preferred embodiment, the deep trenches are separated by between approximately 1600 Å and approximately 2000 Å of nitride material. In an exemplary embodiment, the deep trenches 400 are separated by approximately 1800 Å of nitride material. In another exemplary embodiment, the deep trenches 400 are separated by 2.25×F, wherein F is the minimum resolvable feature size obtainable using a given photolithography technique.

Figure 9:
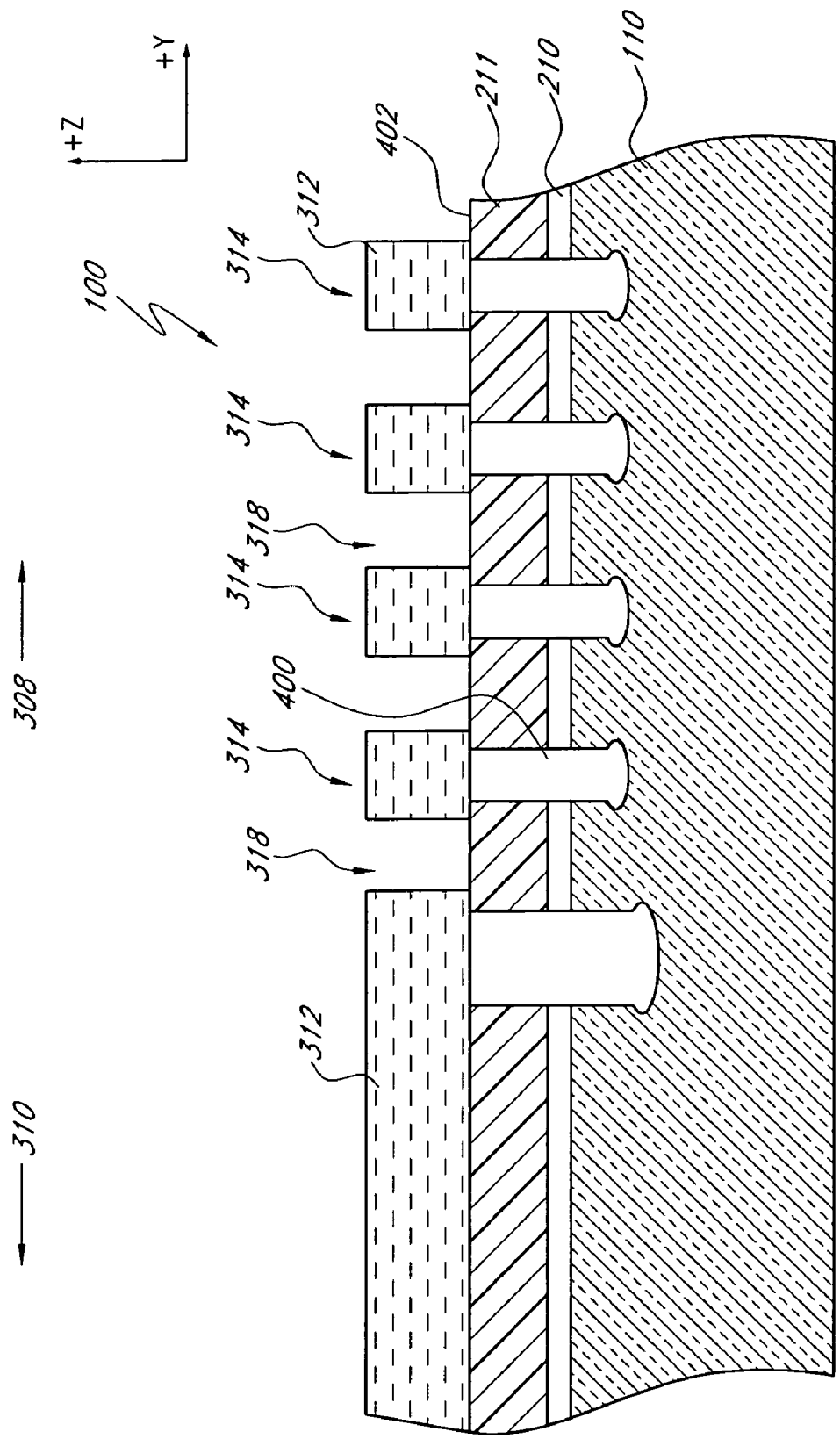
FIG. 9 illustrates a cross-sectional view in the yz plane of the partially-formed semiconductor device of FIG. 8 after patterning a hard mask layer thereover.

FIG. 9 illustrates a cross-section in the yz plane of the device of FIG. 8 after patterning another hard mask layer 312 over the deep trenches 400. In an exemplary embodiment, the hard mask layer 312 is patterned based on a mask similar to that illustrated in FIG. 3, and is patterned using photolithography and etching techniques. The patterned hard mask layer 312 defines a plurality of lines 314 over the planar surface 402, with the lines 314 effectively masking the deep trenches 400. The lines 314 are separated by a plurality of gaps 318. In a preferred embodiment, the lines 314 are between about 1100 Å and about 1300 Å wide, and in an exemplary embodiment, the lines are approximately 1200 Å wide. In certain embodiments, the lines 314 have substantially the same width as the lines 304 formed in the masking process illustrated in FIGS. 3 and 4.

Figure 10:
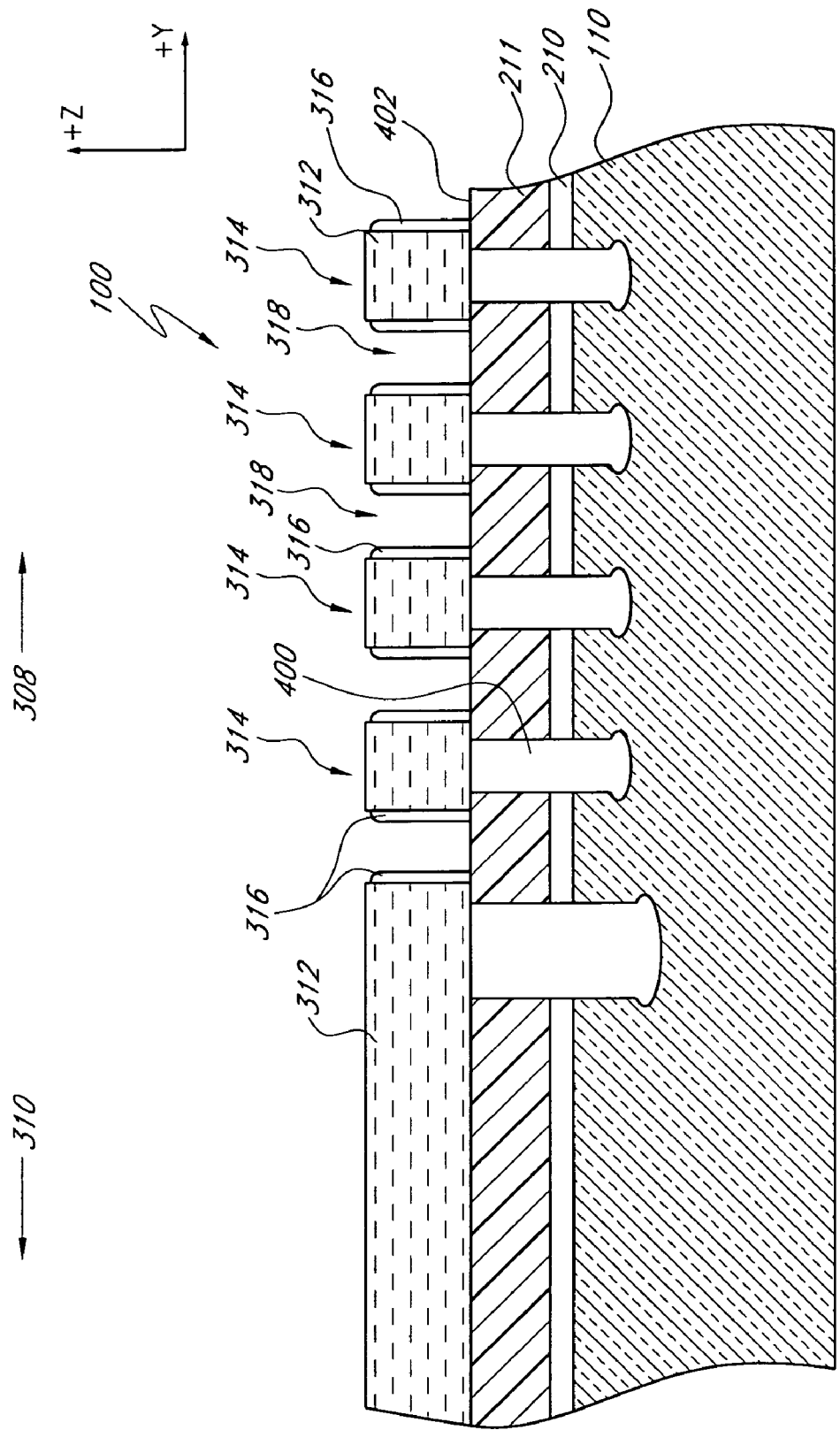
FIG. 10 illustrates a cross-sectional view in the yz plane of the partially-formed semiconductor device of FIG. 9 after forming a plurality of spacers on the vertical sides of the patterned hard mask layer.

FIG. 10 illustrates a cross-section in the yz plane of the device of FIG. 9 after forming a plurality of spacer loops 316 around the lines 314. In an exemplary embodiment, the spacer loops 316 are formed by first depositing a blanket layer of spacer material over the structure illustrated in FIG. 9. The blanket spacer material comprises an oxide material, such as silicon oxide having a thickness that is preferably between about 200 Å and about 500 Å, and more preferably between about 300 Å and about 400 Å. The blanket layer of spacer material is deposited using a suitable deposition process, such as CVD or PVD. A directional spacer etch is then performed to remove the blanket spacer material from horizontal surfaces. The resulting structure is illustrated in FIG. 10. This produces a plurality of spacer loops 316 positioned on the vertical sides of the lines 314. The spacer loops 316, which have a width approximately equal to the thickness of the original blanket spacer material deposition, effectively narrow the width of the gaps 318. Preferably, the gaps 318 have a reduced width of between about 500 Å and about 700 Å after the spacer loops 316 are formed. In an exemplary embodiment, the gaps 318 have a reduced width of about 600 Å after the spacer loops 316 are formed.

Figure 11:
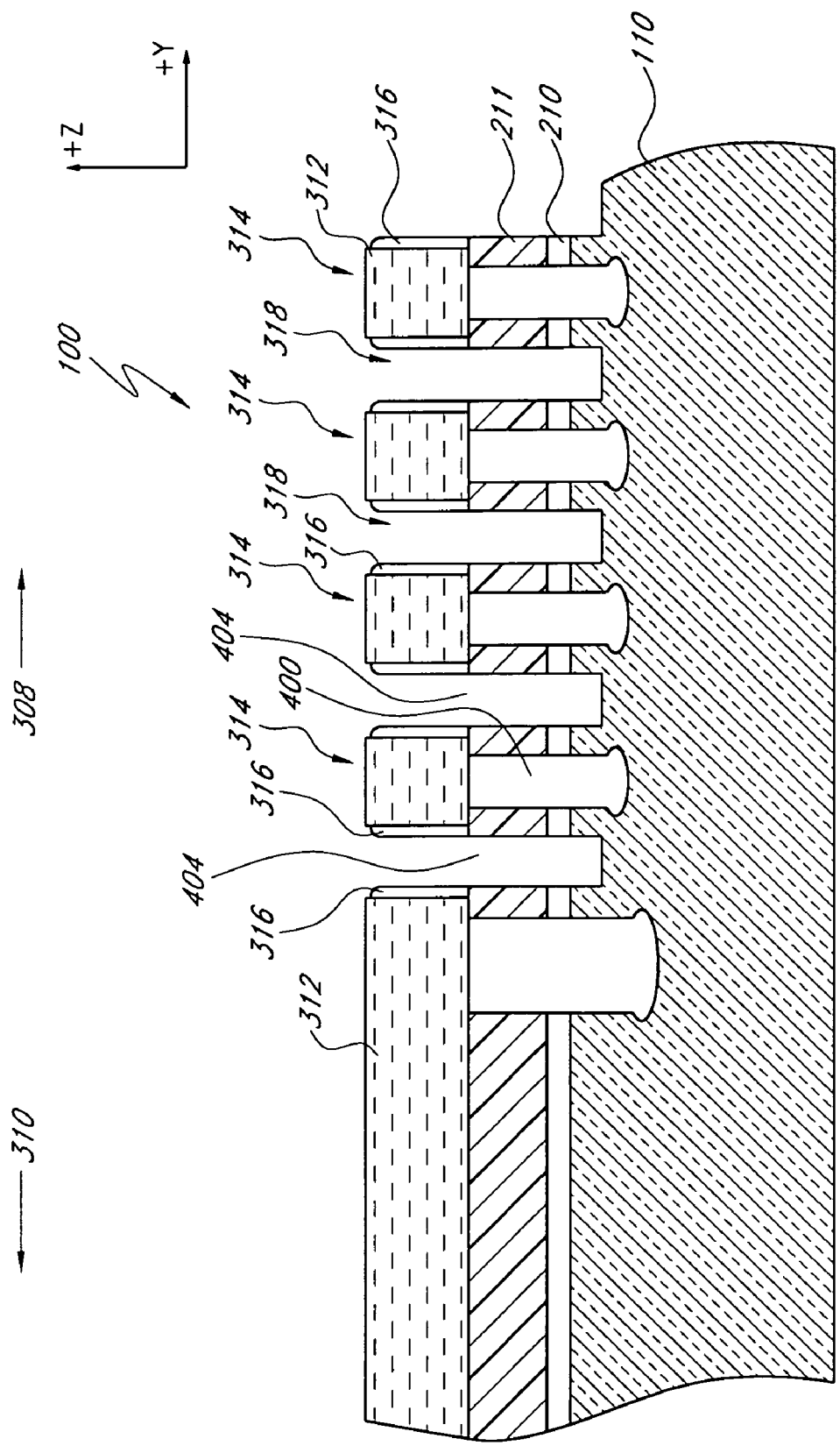
FIG. 11 illustrates a cross-sectional view in the yz plane of the partially-formed semiconductor device of FIG. 10 after etching a plurality of shallow trenches into the substrate.

FIG. 11 illustrates a cross-section in the yz plane of the device of FIG. 10 after etching a plurality of shallow trenches 404 through the nitride layer 211 and the oxide layer 210, and into the substrate 110. The shallow trenches 404 are formed parallel to the deep trenches 400. In one embodiment, the shallow trenches 404 have substantially the same width as the deep trenches 400, but instead are etched to a reduced depth that is preferably between about 500 Å and 2000 Å, and more preferably between about 1000 Å and 1500 Å.

Figure 12:
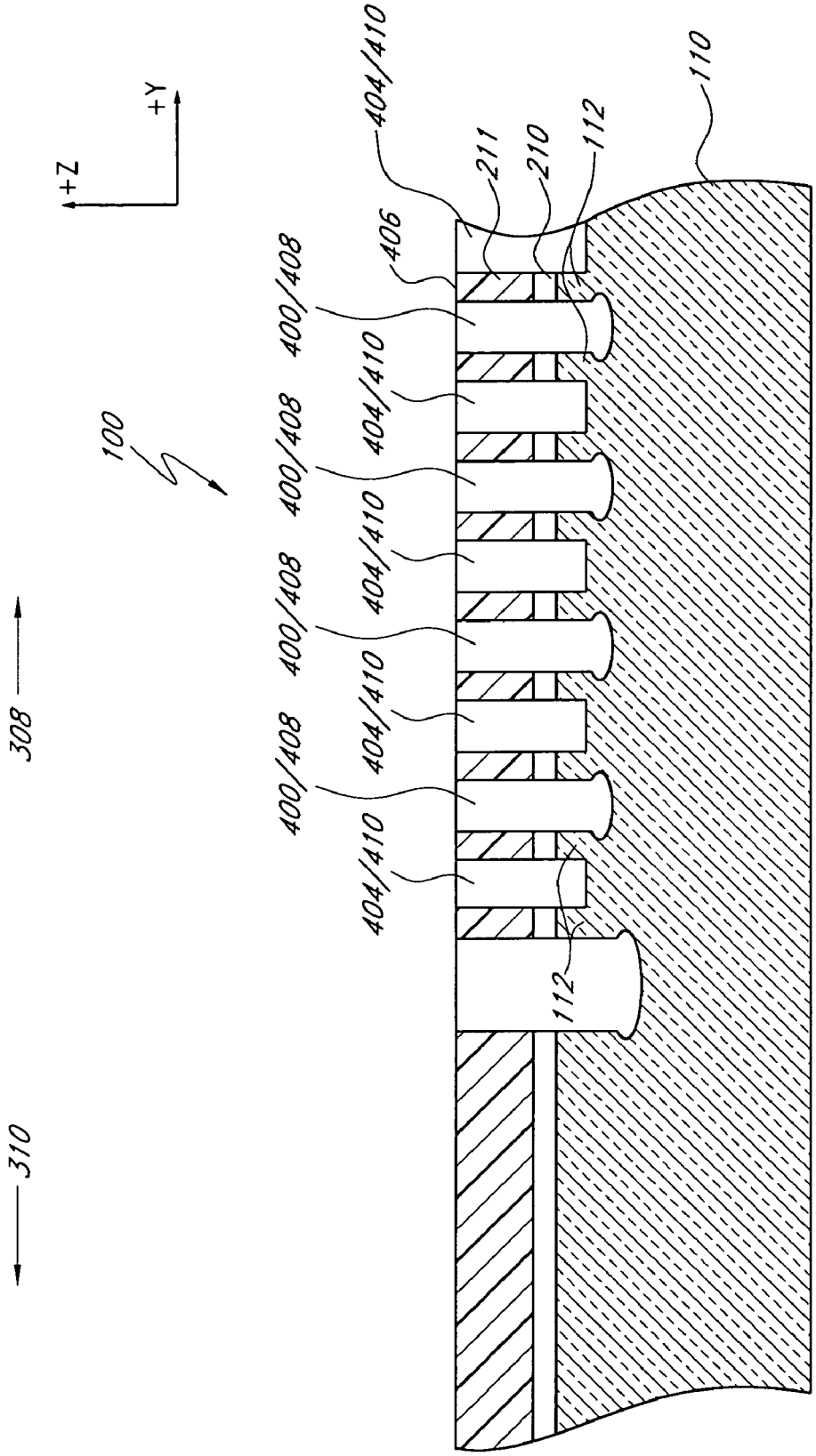
FIG. 12 illustrates a cross-sectional view in the yz plane of the partially-formed semiconductor device of FIG. 11 after filling the shallow trenches with a dielectric material and providing the device with a substantially planar surface.
Figure 13:
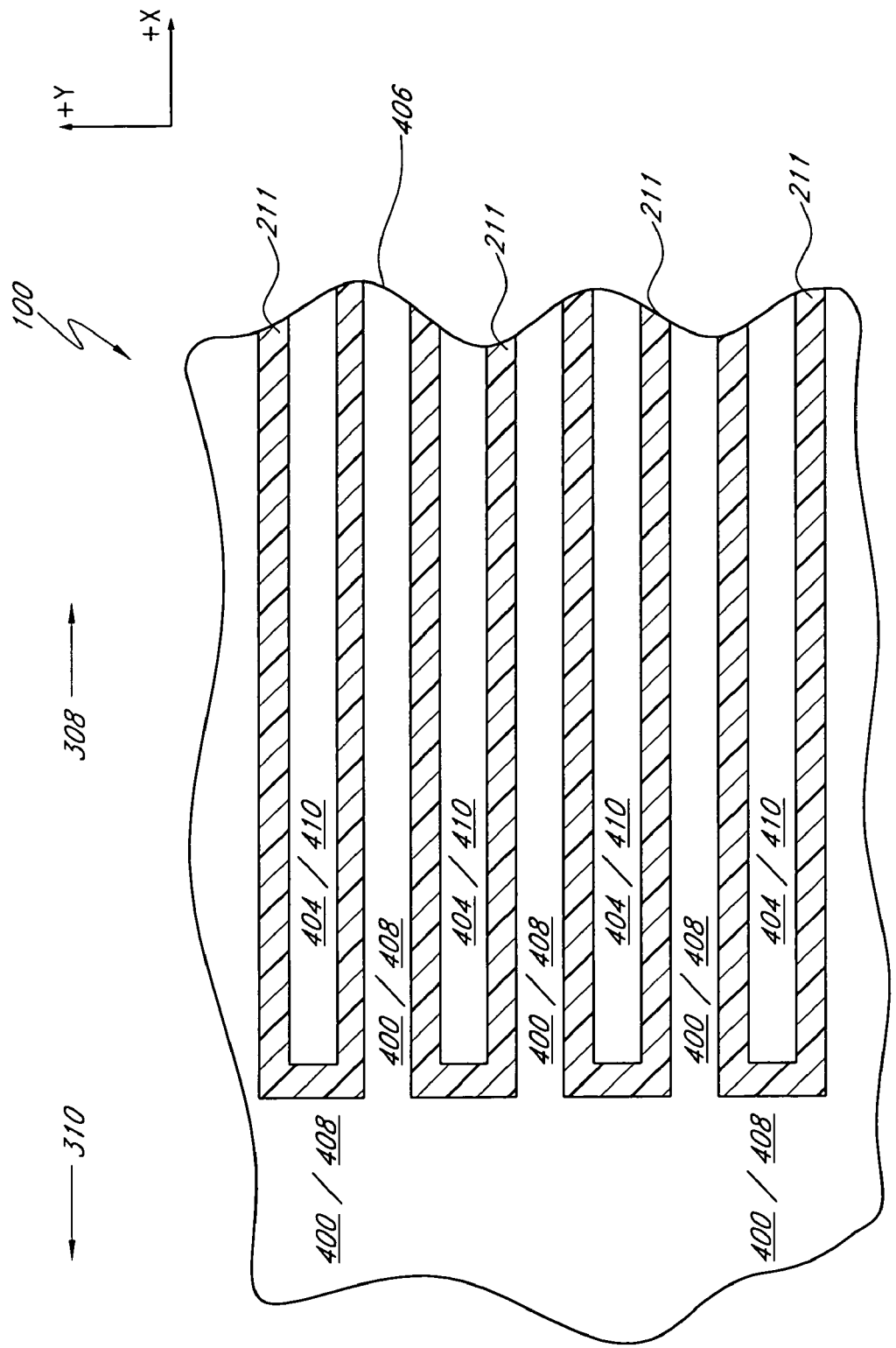
FIG. 13 illustrates a top-down view in the xy plane of the partially-formed semiconductor device of FIG. 12.

FIG. 12 illustrates a cross-section in the yz plane of the device of FIG. 11 after filling the shallow trenches 404 with a SOD material 410. The shallow trenches are optionally filled with the same SOD material 408 used to fill the deep trenches 400. A CMP technique is used to remove the remaining hard mask layer 312, spacer loops 316, and excess SOD material. In a preferred embodiment, the CMP technique is used to reduce the thickness of the nitride layer 211 to between about 300 Å and about 500 Å. In an exemplary embodiment, the CMP technique is used to reduce the thickness of the nitride layer 211 to about 400 Å. The CMP technique also provides the device 100 with a substantially planar surface 406 in the xy plane. As illustrated, the substantially planar surface 406 extends across the device array region 308 and periphery region 310. FIG. 13 illustrates a top-down view in the xy plane of the device 100 of FIG. 12. The device 100 illustrated in FIGS. 12 and 13 comprises a plurality of elongate shallow trenches 404 that are separated from each other by elongate nitride spacers with looped ends, as defined by the remaining nitride layer 211. The nitride spacers are separated from each other by the elongate deep trenches 400.

Figure 25:
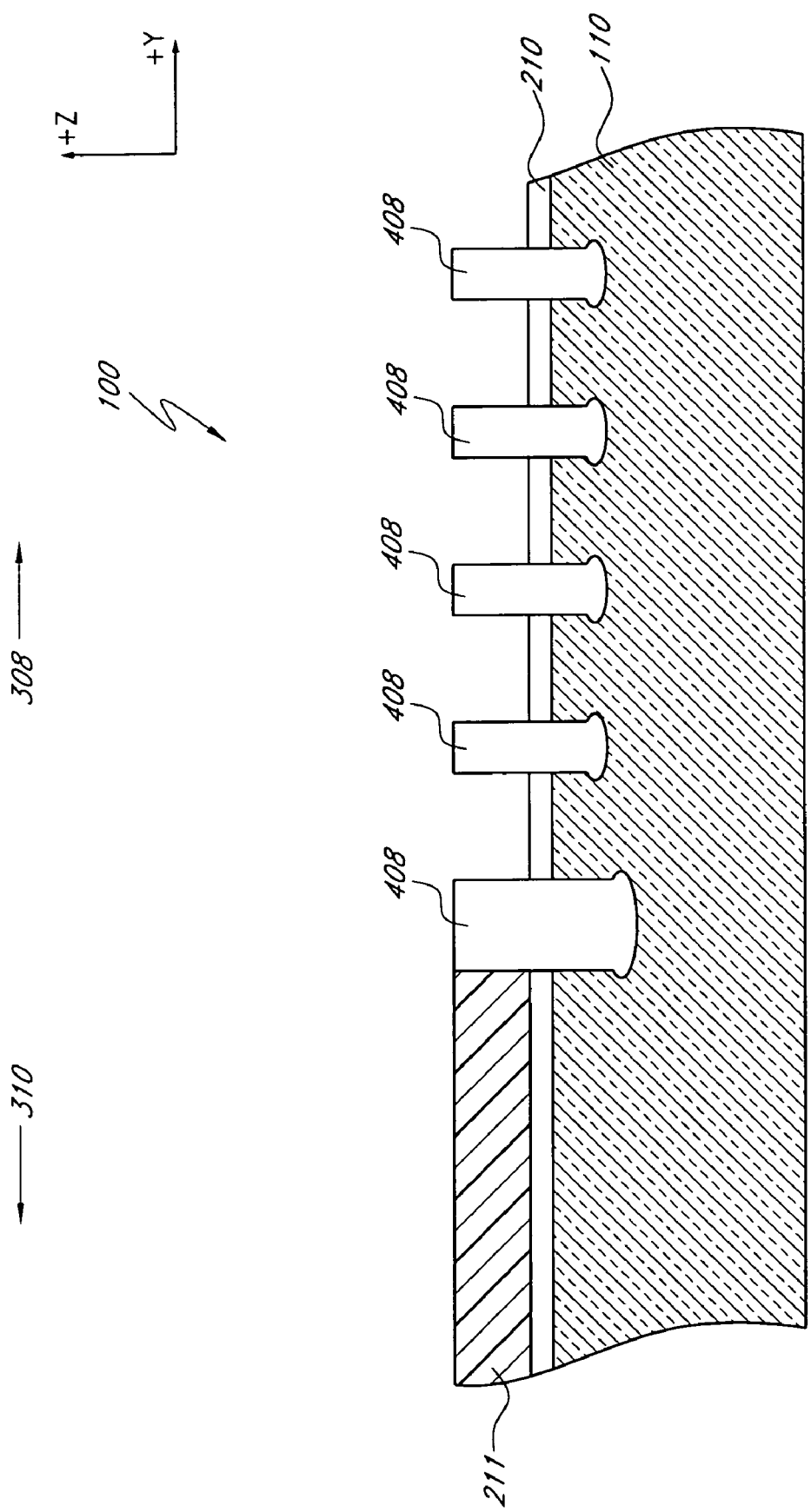
FIG. 25 illustrates a cross-sectional view in the yz plane of the partially-formed semiconductor device of FIG. 8 after etching the nitride layer in the array region.
Figure 26:
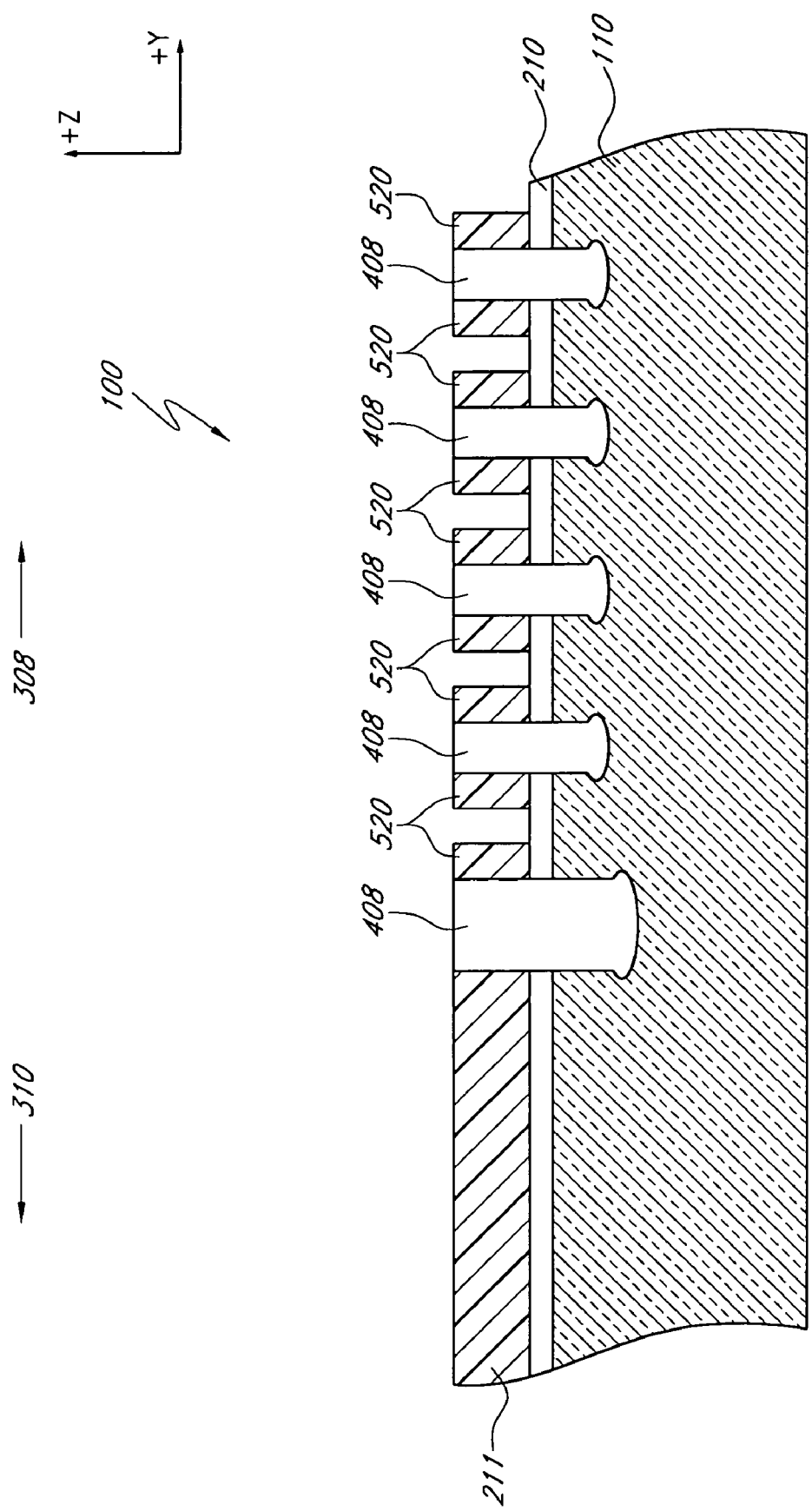
FIG. 26 illustrates a cross-sectional view in the yz plane of the partially-formed semiconductor device of FIG. 25 after forming nitride spacers around the protruding spin-on-dielectric material.

In a modified embodiment, the structure illustrated in FIGS. 12 and 13 is obtained using a process that self-aligns in the deep trenches 400 and the shallow trenches 404. As illustrated in FIG. 25, this self-alignment is achieved by first etching the nitride layer 211 in the array region 308. As illustrated in FIG. 26, nitride spacers 520 are then formed around the protruding SOD material 408 structures, which now act as mandrels. The nitride spacers 520 are then used to subsequently pattern shallow trenches, which are etched through the oxide layer 210 and into the substrate 110. The resulting structure is equivalent to the structure illustrated in FIGS. 12 and 13, and is obtained without the use of the hard mask layer 312 illustrated in FIG. 9.

Figure 14:
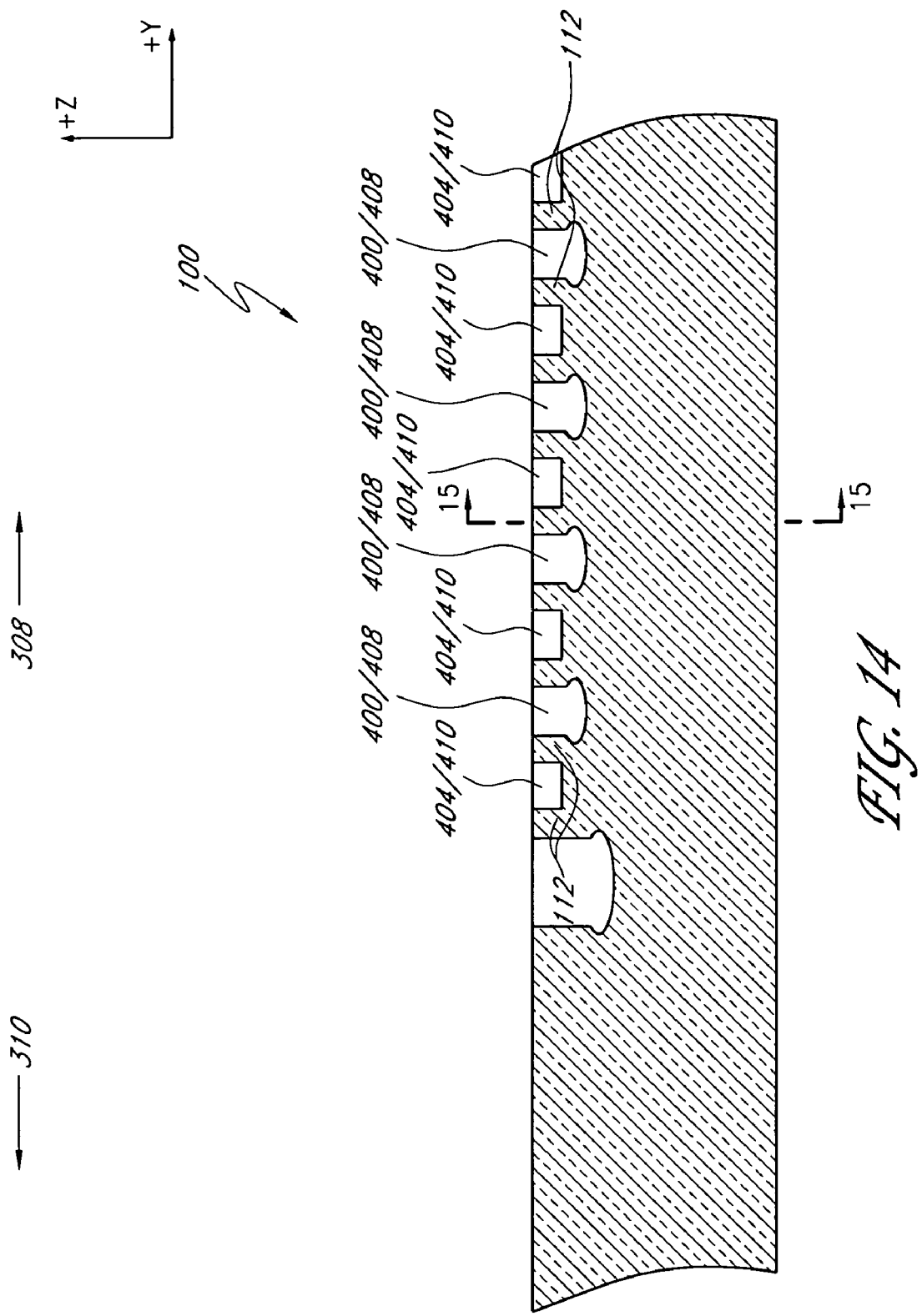
FIG. 14 illustrates a cross-sectional view in the yz plane of the partially-formed semiconductor device of FIG. 12 after removing residual masking layers.

FIG. 14 illustrates a cross-section in the yz plane of the device of FIGS. 12 and 13 after removal of the remaining nitride layer 211 and oxide layer 210. In an exemplary embodiment, the remaining portions of these layers are removed using an etching process, although other techniques are used in other embodiments. Subsequently performing a CMP technique results in a substantially planar surface of alternating silicon regions and oxide regions. The silicon regions define a plurality of elongate loops 112 that extend parallel to the x axis. The elongate loops 112 surround shallow trenches 404, and are separated from each other by the deep trenches 400.

Figure 15:
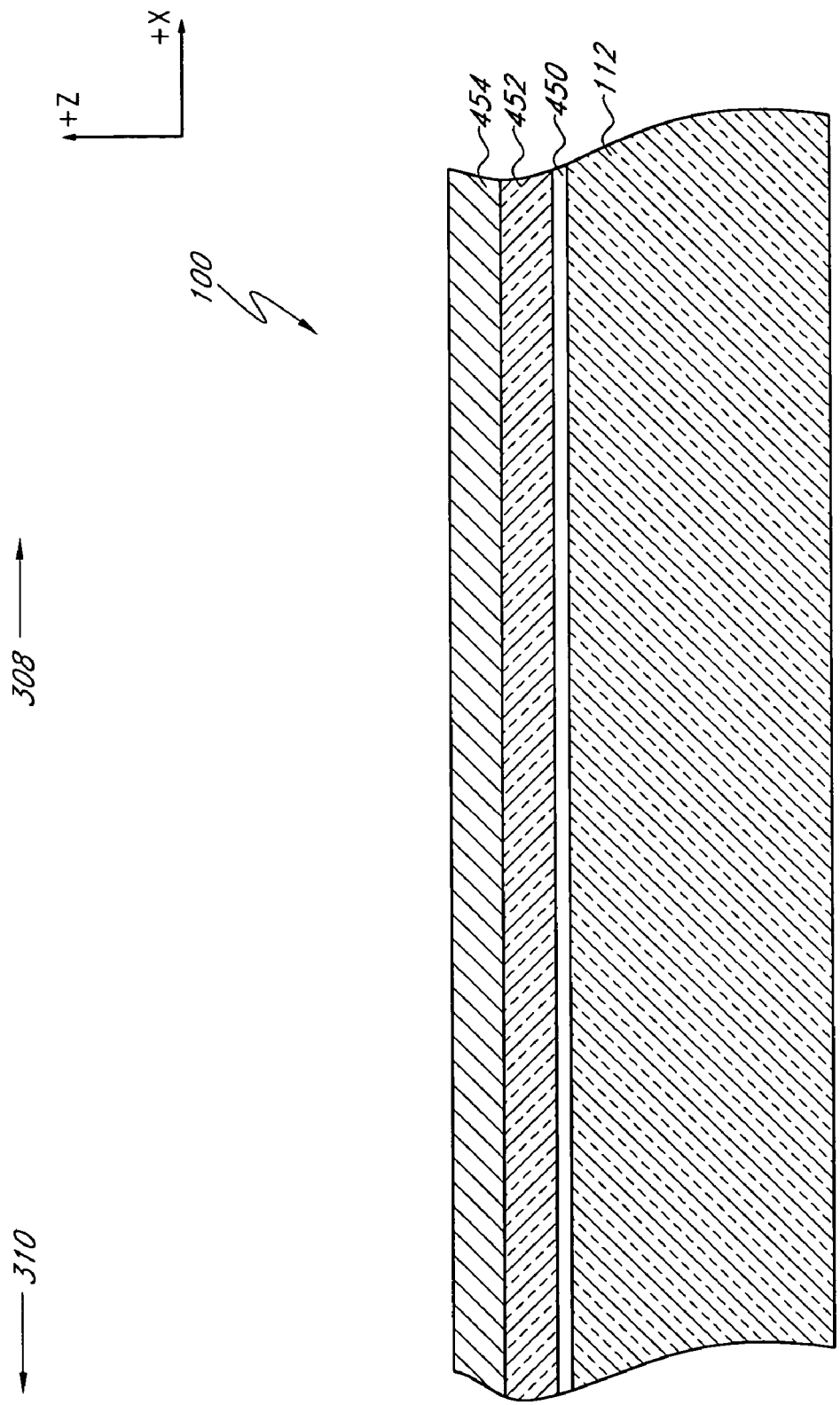
FIG. 15 illustrates a cross-sectional view in the xz plane of the partially-formed semiconductor device of FIG. 14, taken along line 15-15, after depositing gate stack layers thereover.

The elongate loops 112 are separated into individual transistor pillars by etching the loops perpendicular to their length, that is, parallel to the y axis. In certain embodiments, active devices are formed in the device periphery region 310 using the same masking sequence that is used to etch the elongate loops 112 into individual transistor pillars. In such embodiments, active device layers are blanket deposited over the device illustrated in FIG. 14. The resulting structure is shown in FIG. 15, which illustrates a cross-section in the xz plane of the device of FIG. 14 after forming an oxide layer 450, a polycrystalline silicon layer 452, and a tungsten silicide layer 454. The cross-section illustrated in FIG. 15 illustrates these layers formed over a silicon region 114; however because these layers are blanket deposited, they also extend over the deep trenches 400 and the shallow trenches 402. Likewise, the blanket layers also extend over both the device array region 308 and periphery region 310. In one embodiment, the blanket oxide layer 450 has a thickness between about 50 Å and 80 Å. In one modified embodiment, other metallic materials are used in place of tungsten silicide to strap peripheral gates and improve lateral signal speed. In another modified embodiment, an optional blanket silicon nitride layer (not shown) is formed over the tungsten silicide layer 454. In yet another embodiment, the polycrystalline silicon layer 452 comprises a conductive material, wherein the term "conductive material" includes silicon, even if undoped as deposited.

In a modified embodiment, the tungsten silicon layer 454 is omitted, and is replaced with additional thickness of the polycrystalline silicon layer 452. This configuration advantageously removes metal from the structure, thereby reducing the likelihood of introducing contamination into other structures during subsequent processing. In such embodiments, the metal is added during a subsequent silicidation process.

Figure 16:
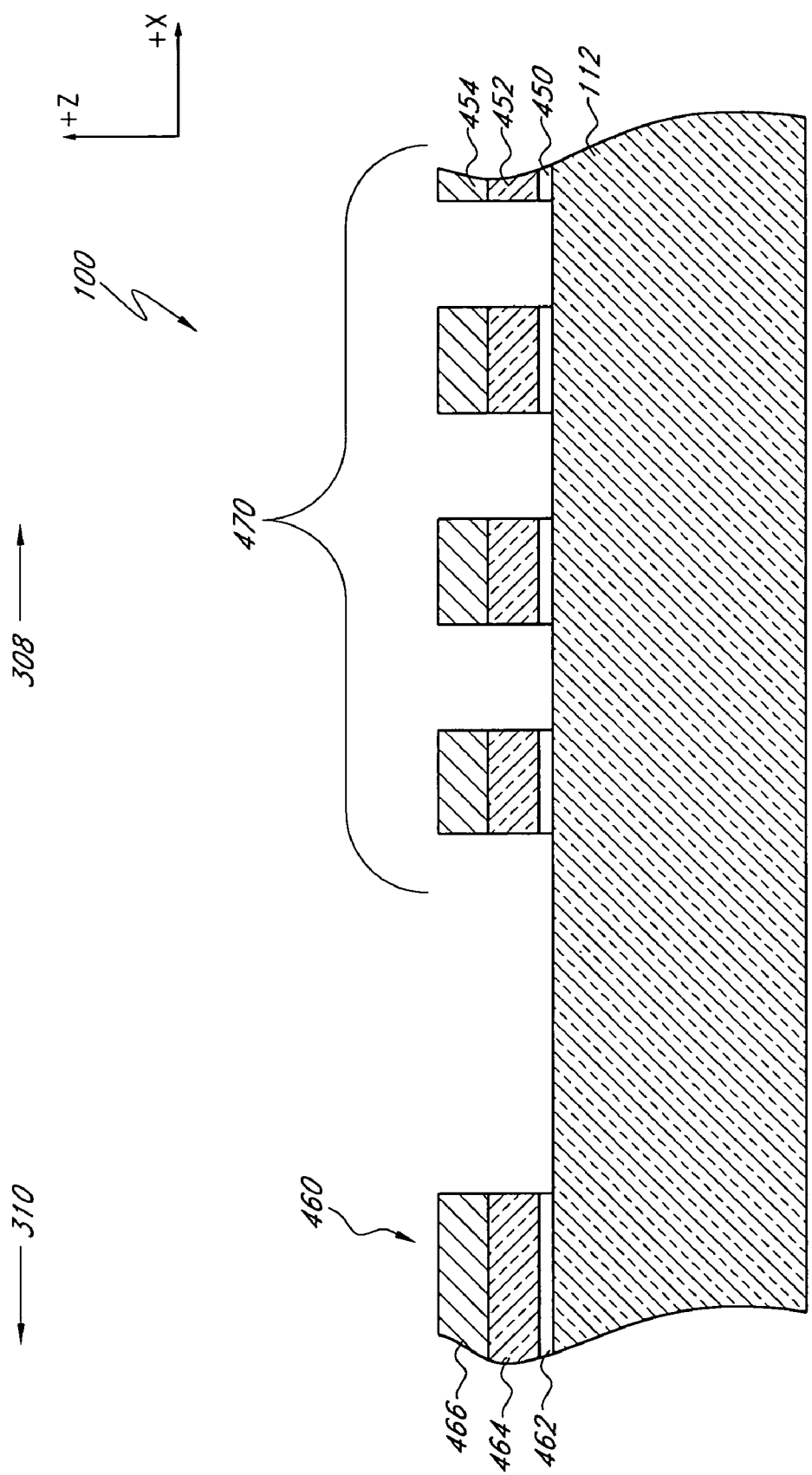
FIG. 16 illustrates a cross-sectional view in the xz plane of the partially-formed semiconductor device of FIG. 15 after patterning active devices in the periphery region and lines in the array region.

By patterning the blanket-deposited oxide layer 450, polycrystalline silicon layer 452 and tungsten silicide layer 454, active devices are formed in the periphery region 310. FIG. 16 illustrates a cross-section in the xz plane of the device of FIG. 15 after patterning the blanket-deposited layers. In an exemplary embodiment, the layers are patterned using photolithography and masking techniques. In the illustrated exemplary embodiment, one or more active devices 460 are formed in the periphery region 310. In such embodiments, the active devices comprise a stack including a gate oxide 462, a polycrystalline silicon active area 464, and a tungsten silicide strapping layer 466. In other embodiments, the strapping layer 466 comprises other metallic materials, such as tungsten, titanium nitride, tantalum, and tantalum nitride. Mixtures of metals are also suitable for forming the strapping layer 466.

Still referring to FIG. 16, the same photolithography and masking technique that is used to form active devices 460 in the periphery region is used to pattern a series of lines 470 in the array region 308. The array lines 470 comprise the same materials as the peripheral active devices 460, although the array lines 470 are used as a sacrificial mask to pattern the underlying elongate loops 112 in subsequent processing steps. Additionally, the pattern of lines 470 in the array region 308 has a smaller pitch as compared to the pattern of active devices 460 in the periphery region 310. For example, in one embodiment the lines 470 are spaced apart by a spacing F, wherein the active devices 460 are spaced apart by a spacing 2F, wherein F is the minimum resolvable feature size obtainable using a given photolithography technique. In another embodiment, the active devices 460 have a spacing that is between about two times and about four times larger than the spacing for lines 470. The array lines 470, which extend parallel to the y axis, are perpendicular to the elongate loops 112, which extend parallel to the x axis.

Figure 17:
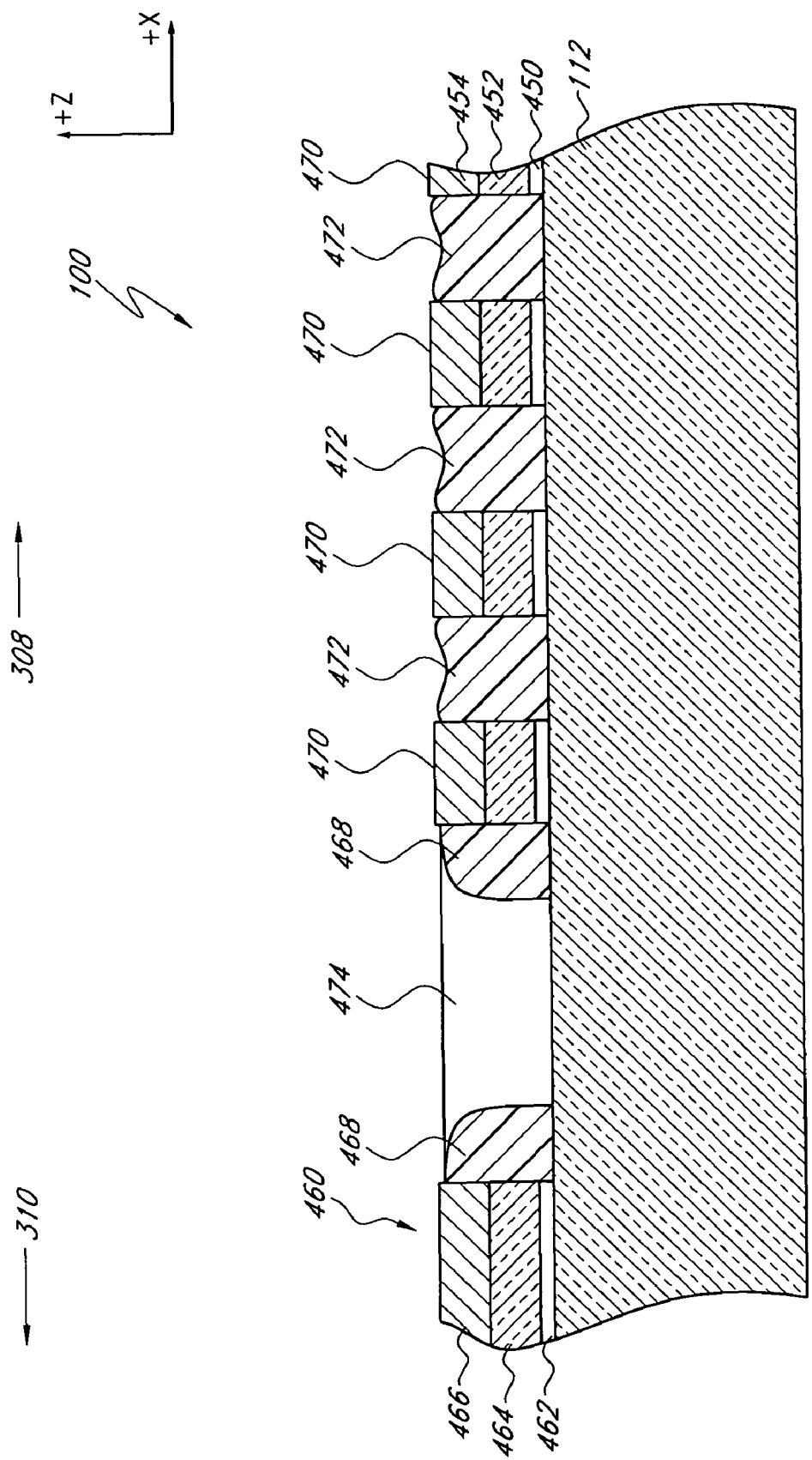
FIG. 17 illustrates a cross-sectional view in the xz plane of the partially-formed semiconductor device of FIG. 16 after forming spacer material around the periphery region active devices and between the array region lines.

FIG. 17 illustrates a cross-section in the xz plane of the device of FIG. 16 after forming silicon nitride spacers 468 around the active devices 460 in the periphery region 310. In a preferred embodiment, the silicon nitride spacers 468 have a thickness of between about 200 Å and about 800 Å. In an exemplary embodiment, the silicon nitride spacers 468 have a thickness of about 600 Å, and are formed by blanket depositing silicon nitride over the device, followed by a directional etch that removes the deposited material from horizontal surfaces. This technique also results in silicon nitride spacers 468 being formed around the array lines 470 in the array region 308. Furthermore, because the spacing between the array lines 470 is smaller than the width of two silicon nitride spacers 468, the silicon nitride spacer material 468 fills the region between the lines, thereby forming a pattern of filled gaps 472 between the lines 470. An SOD material 474, such as silicon oxide, is formed in the regions of exposed silicon. In modified embodiments, a material other than silicon nitride is used to form the spacers and filled gaps; other suitable materials include materials that are selectively etched with respect to polycrystalline silicon and silicide materials.

Figure 18:
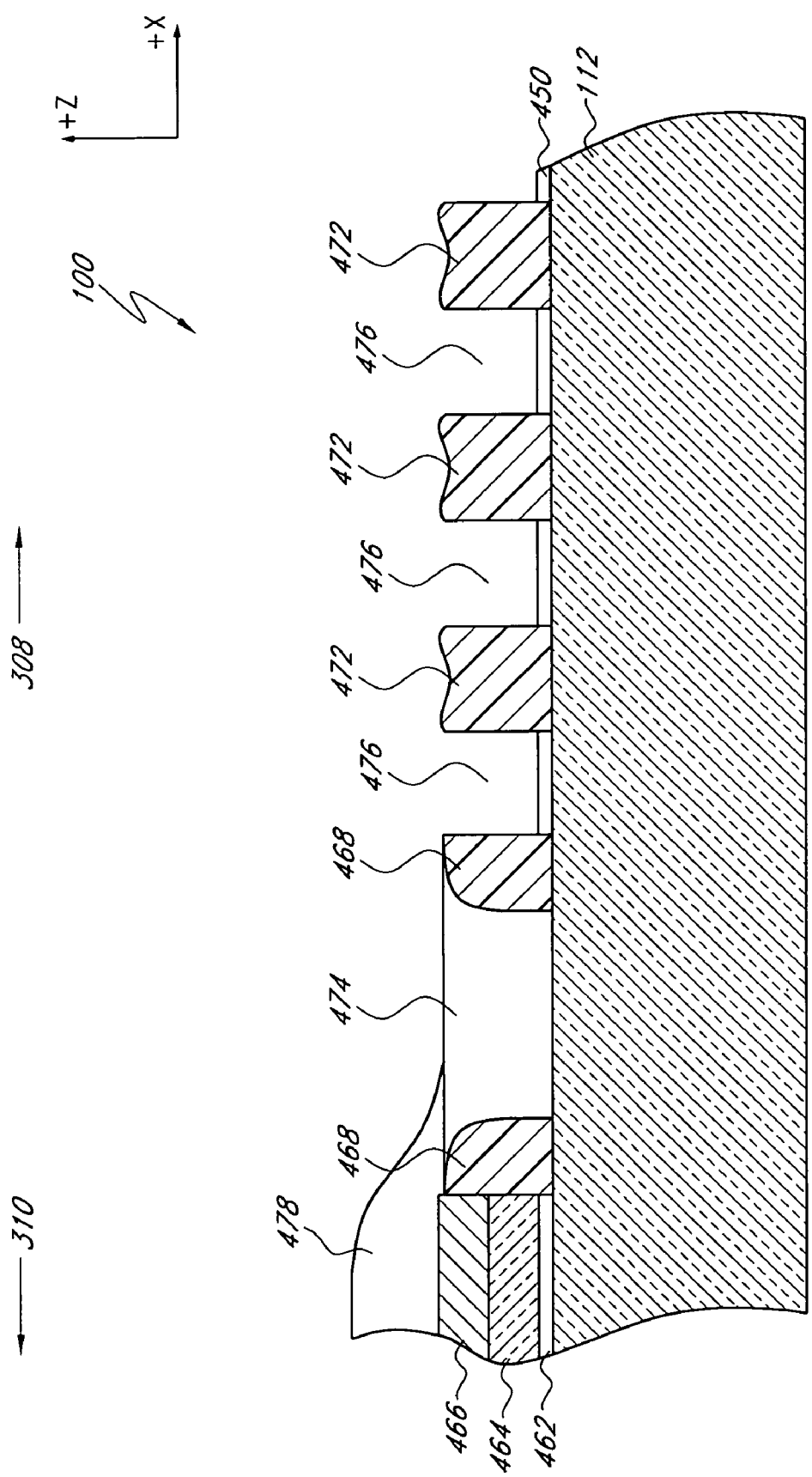
FIG. 18 illustrates a cross-sectional view in the xz plane of the partially-formed semiconductor device of FIG. 17 after masking the device periphery region and etching gate stack layers from the unmasked array portions of the device.

FIG. 18 illustrates a cross-section in the xz plane of the device of FIG. 17 after masking the device periphery region 310 and etching gate mandrels from the device. A mask 478 is formed over the periphery region 310 to protect the active devices 460 in the periphery region 310 during subsequent processing steps. Advantageously, the mask 478 is simple as it merely covers the periphery region 310 and opens the array 308, and therefore does not include "critical dimension" features. After the periphery region 310 is masked, the remaining portions of the tungsten silicide layer 454 and the polycrystalline silicon layer 452 are etched from the exposed portions of the device, such as the array region 308. In an exemplary embodiment, an etchant that is selective for polycrystalline silicon relative to oxide and nitride is used, such as tetramethylammonium hydroxide ("TMAH"). Other etchants are used in other embodiments. This results in the creation of trenches 476 between the nitride material of the filled gaps 472. In an exemplary embodiment, the silicon is etched to the oxide layer 450, which acts as an etch stop.

Figure 19:
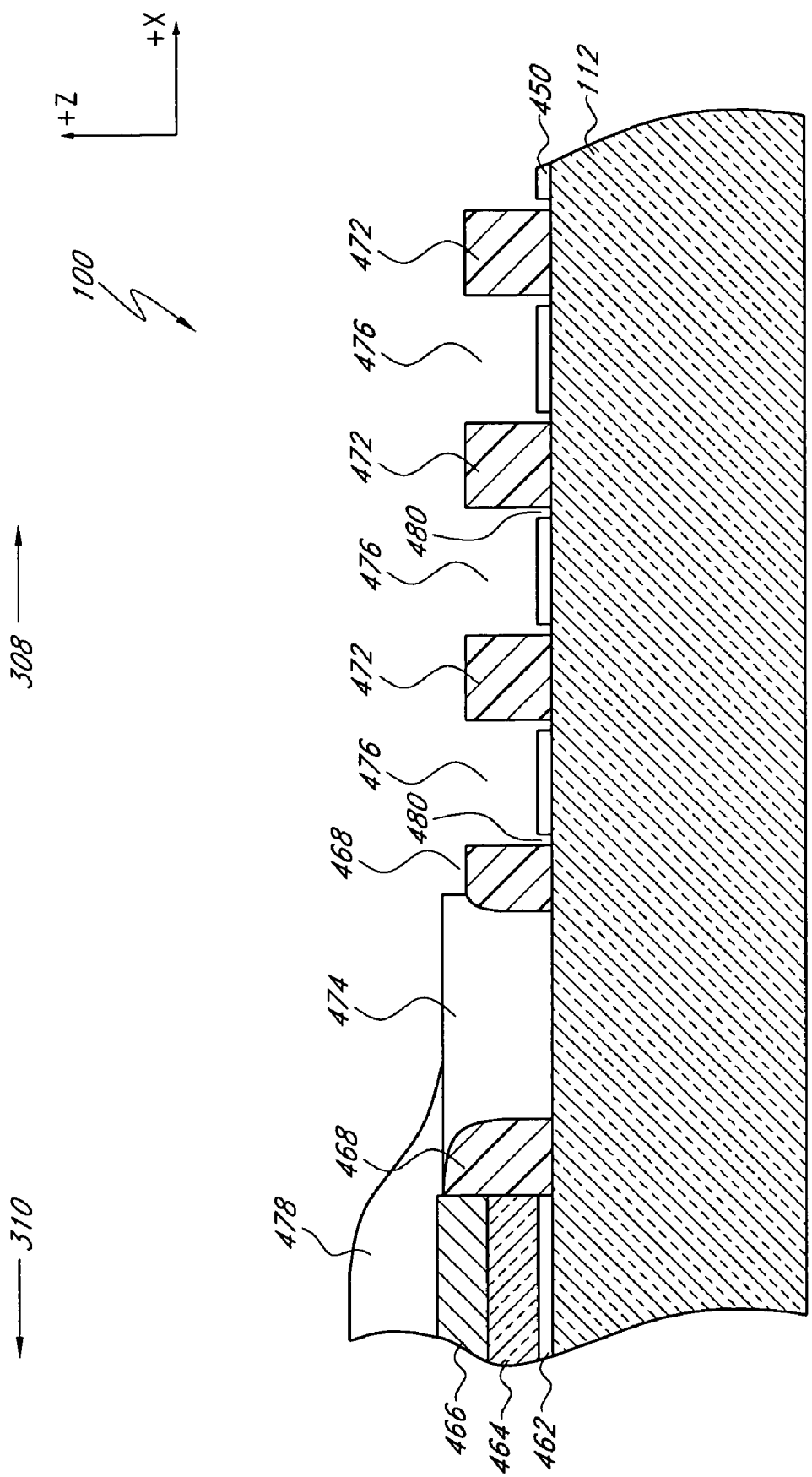
FIG. 19 illustrates a cross-sectional view in the xz plane of the partially-formed semiconductor device of FIG. 18 after shrinking the remaining spacer material using a isotropic etch.

FIG. 19 illustrates a cross-section in the xz plane of the device of FIG. 18 after shrinking the remaining nitride portions of the filled gaps 472. In an exemplary embodiment, this is accomplished by isotropically etching nitride from exposed portions of the device. As illustrated, the isotropic nitride etch advantageously creates an area of exposed silicon/dielectric 480 as the remainder of the filled gaps 472 are etched away from the remaining oxide layer 450. In an exemplary embodiment, the remainder of the filled gaps 472 are etched to have a width corresponding to the width of the underlying silicon elongate loops 112, illustrated in FIG. 14. In another exemplary embodiment, the remainder of the filled gaps 472 are etched to have a width of about ½ F, where F is the minimum resolvable feature size obtainable using a given photolithography technique.

Figure 20:
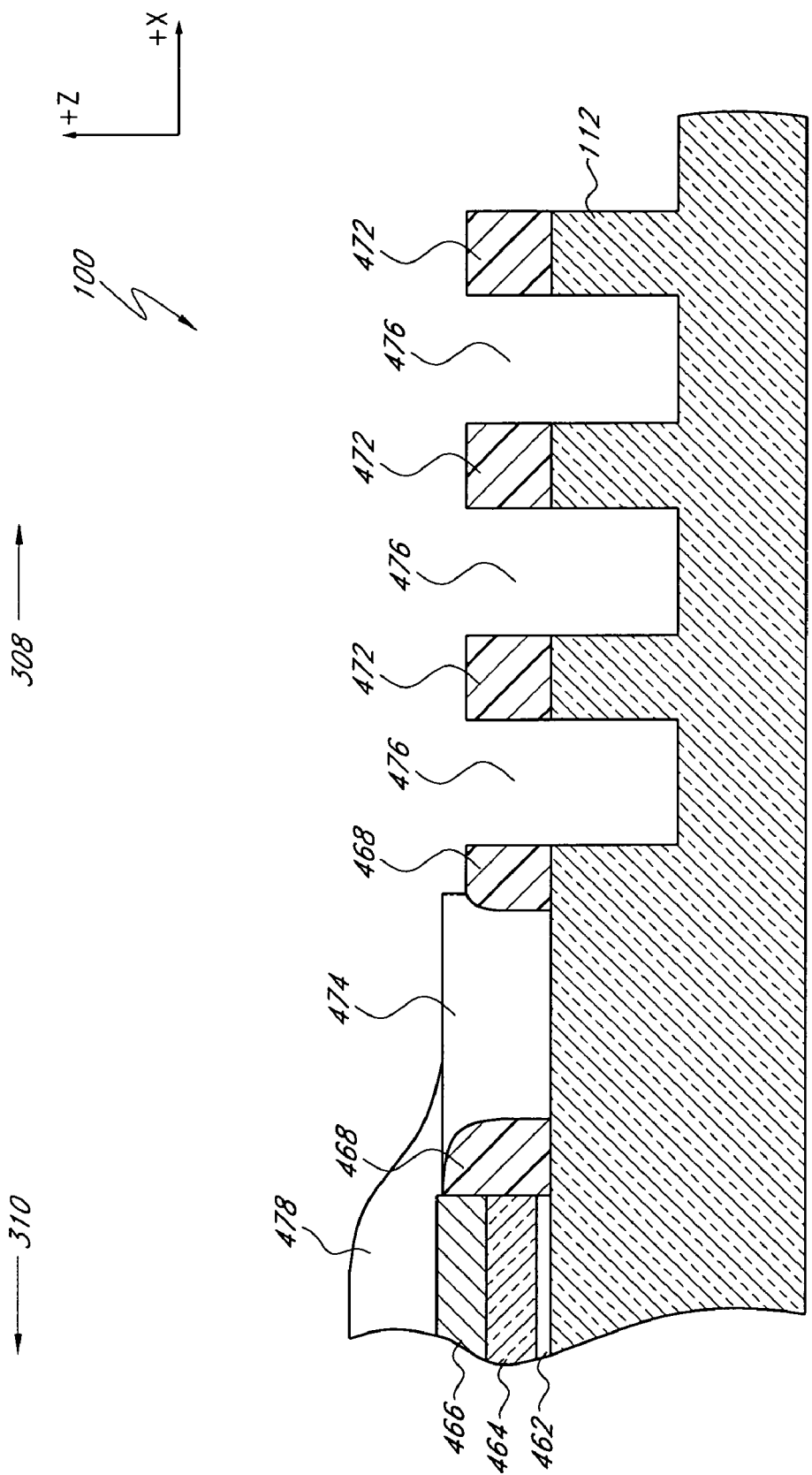
FIG. 20 illustrates a cross-sectional view in the xz plane of the partially-formed semiconductor device of FIG. 19 after etching a pattern of intermediate trenches into the structure illustrated in FIG. 14.

FIG. 20 illustrates a cross-section in the xz plane of the device of FIG. 19 after etching the pattern of the trenches 476 into the underlying structure illustrated in FIG. 14. In an exemplary embodiment, the trenches 476 are extended to an intermediate depth that is between the depth of the deep trenches 400 and the shallow trenches 404, illustrated in FIG. 14. The pattern of the intermediate trenches 476 is defined by the remaining nitride filled gaps 472. This effectively cuts the silicon elongate loops 112, the deep trenches 400, and the shallow trenches 404 to form a plurality of U-shaped transistor pillars. The shallow trenches 404 form the middle gap of the U-shaped transistor pillars. In one embodiment, the U-shaped transistor pillars function source/drain regions for a U-shaped semiconductor structure.

Figure 21:
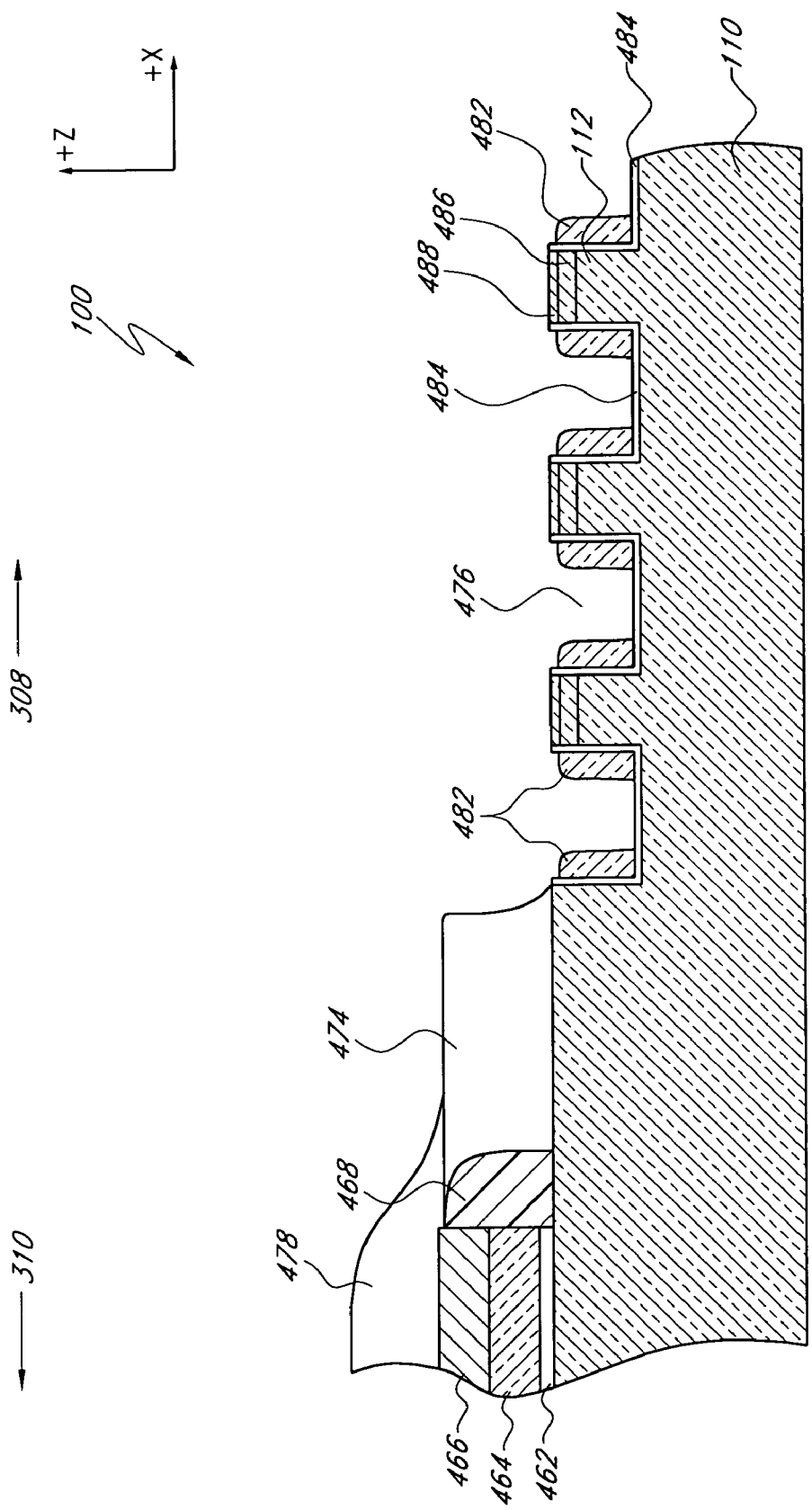
FIG. 21 illustrates a cross-sectional view in the xz plane of the partially-formed semiconductor device of FIG. 20 after removing remaining spacer material from the array region, lining the intermediate trenches with a dielectric, and forming sidewall spacers of gate material in the intermediate trenches.

FIG. 21 illustrates a cross-section in the xz plane of the device of FIG. 20 after removing excess nitride material and forming a plurality of sidewall spacers 482 in the intermediate trenches 476. The sidewall spacers 482 are separated from the silicon substrate 110 by a thin oxide layer 484, such as a thermal oxide. As described herein, in an exemplary embodiment a portion of the substrate 110 corresponding to the region of the elongate loops 112 is doped to include a lightly doped n⁻ region 486 that is positioned underneath a heavily doped n⁺ region 488, although p-type doping can be employed in other embodiments. Preferably, a lower portion of the elongate loops 112 is doped oppositely from an upper portion of the elongate loops 112. In one embodiment, the sidewall spacers 482 have a width that is greater than or equal to half of a width of the elongate loops 112.

Figure 22:
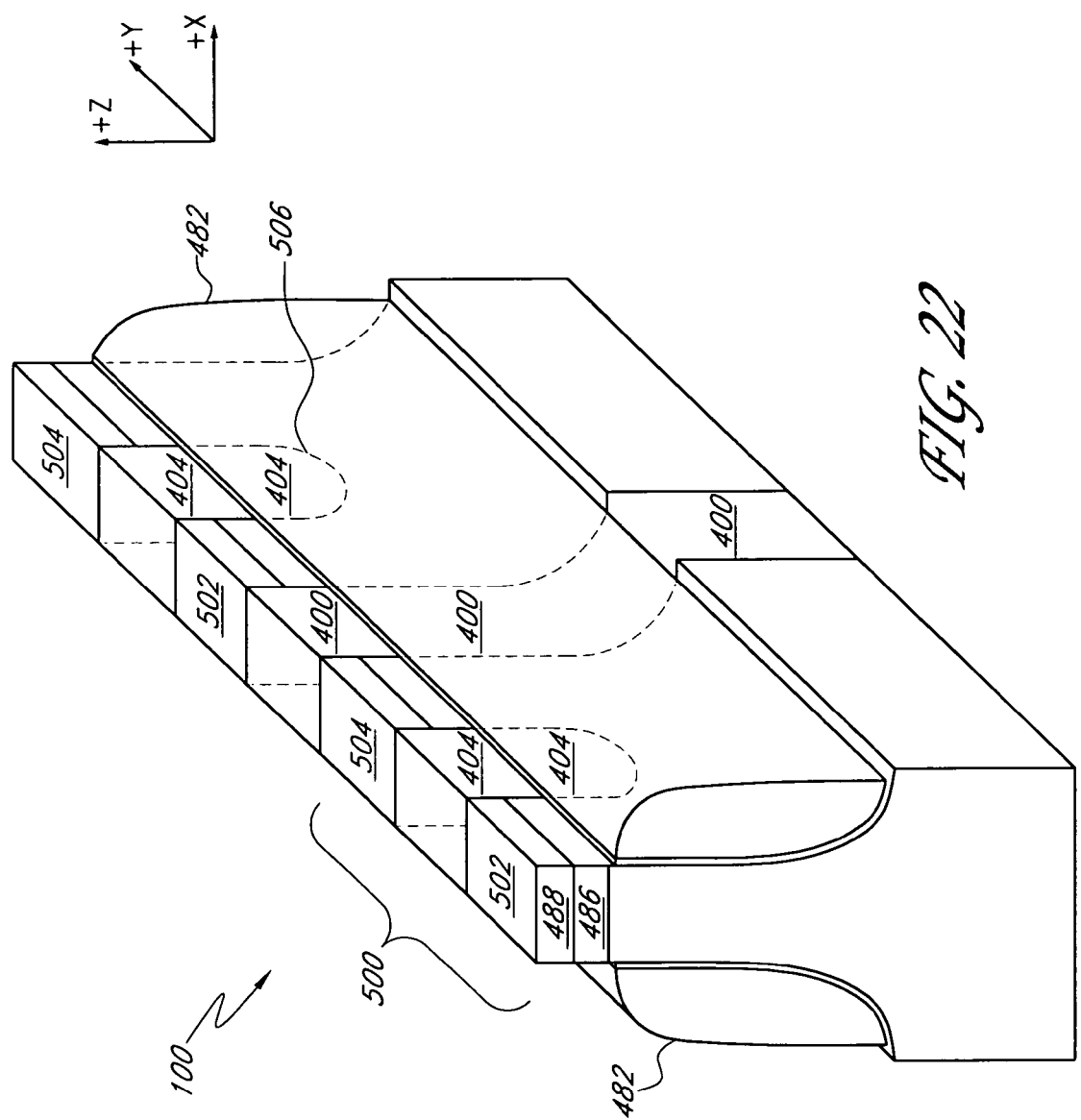
FIG. 22 illustrates a perspective view of a portion of the partially-formed semiconductor device of FIG. 21.

FIG. 22 provides a three-dimensional illustration of a portion of the partially-formed semiconductor device of FIG. 21. As illustrated, the device includes a plurality of transistor pillars that form the source 502 and drain 504 regions of a U-shaped transistor 500. The source 502 and drain 504 regions are separated by a shallow trench 404 which runs parallel to the x axis. The channel length of the transistor is the length extending from the source 502 to the drain 504 through the U-shaped channel region 506. The channel characteristics of the device are influenced by tailoring the dopant concentrations and types along the channel surfaces on opposite sides of the U-shaped protrusions. Neighboring U-shaped transistors 500 are separated from each other in the y dimension by deep trenches 400, and in the x dimension by lined with gate electrode sidewall spacers 482, which are positioned in the intermediate trenches.

Figure 27:
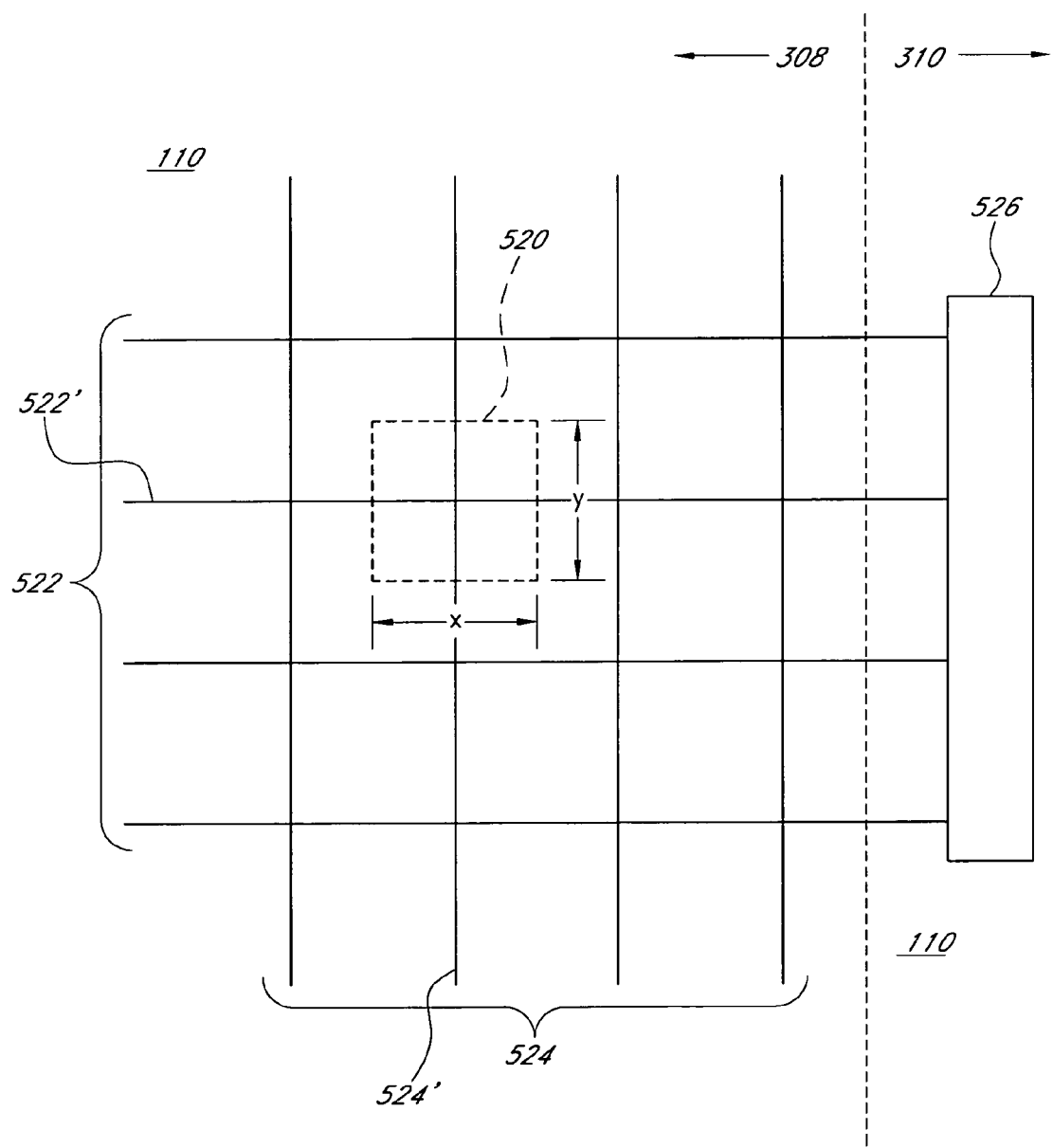
FIG. 27 is a schematic plan view of a memory device that illustrates the position of a memory cell with respect to an array of bit lines and word lines.

FIG. 27 schematically illustrates the dimensions of a memory cell 520 that is positioned in the array region 308 of a memory device. The memory cell 520 is located at the intersection of a selected bit line 522' in a bit line array 522 and a selected word line 524' in a word line array 524. The periphery region 310 of the memory device optionally includes logic circuitry 526 that is connected to the bit line array 522 and/or the word line array 524, as schematically illustrated in FIG. 27. The memory cell 520 occupies an area of the substrate 110 having dimensions x×y, and thus size of the memory cell is generally expressed as $xyF^2$, where x and y are multiples of the minimum resolvable feature size F obtainable using a given photolithography technique, as described herein. The memory cell 520 typically comprises an access device (such as a transistor) and a storage device (such as a capacitor). However, other configurations are used in other embodiments. For example, in a cross-point array the access device can be omitted or an access device can be integrated with the storage device, as in MRAM, EEPROM or PCRAM (for example, silver-doped chalcogenide glass), where the status of a switch acts both as a switch and to store a memory state.

In the illustrated embodiment, the memory cell 520 is a DRAM cell employing the structure illustrated in FIG. 23. The structure illustrated in FIG. 23 includes a single U-shaped transistor 500 having a source 502 and a drain 504 separated by a shallow trench 404. The source 502 and drain 504 are connected by a channel region 506, which is contiguous with the silicon substrate 110. This configuration advantageously avoids the floating body effect that is common in conventional vertical pillar transistors. Gate electrode sidewall spacers 482 are formed perpendicular to the shallow trench 404 and loop around both sides of the U-shaped semiconductor (silicon) protrusion. In an exemplary embodiment, a capacitor 510 or other storage device is formed over the drain 504, and an insulated bit line 512 is formed over the source 502. As illustrated, the dimensions of the capacitor 510 and insulated bit line 512 are large compared to the dimensions of the pitch-doubled features of the U-shaped transistor 500. In an exemplary embodiment wherein the source 502 and drain 504 are provided with a feature size of ½ F, the overlying capacitor 510 and insulated bit line 512 advantageously accommodate a misalignment of up to ⅜ F, wherein F is the minimum resolvable feature size obtainable using a given photolithography technique. In the example embodiment that is illustrated in FIG. 23, the memory cell 520 occupies a space on the substrate that is preferably between about 4 $F^2$ and about 8 $F^2$, and is more preferably between about 4 $F^2$ and about 6.5 $F^2$.

The configuration of the U-shaped transistor 500 advantageously allows the dimensions of the transistors that forms a part of a memory cell to be independently scaled in the x and y dimensions, as illustrated in FIGS. 22, 23 and 27. For example, this allows a memory cell occupying an area 6 $F^2$ on the substrate to be formed with a wide variety of different aspect ratios, including a 2.45 F×2.45 F square, a 3 F×2 F rectangle, and 2 F×3 F rectangle. Generally, the aspect ratio of the transistors comprising the memory device is adjustable by manipulating the dimensions of the intermediate trenches 476 and the deep trenches 400 that separate the transistors.

The capacitor 510 and insulated bit line 512 are used to interface the device 100 with other electronic circuitry of a larger system, including other devices which rely on memory such as computers and the like. For example, such computers optionally include processors, program logic, and/or other substrate configurations representing data and instructions. The processors optionally comprise controller circuitry, processor circuitry, processors, general purpose single chip or multiple chip microprocessors, digital signal processors, embedded microprocessors, microcontrollers and the like. Thus, the device 100 is able to be implemented in a wide variety of devices, products and systems.

Figure 24:
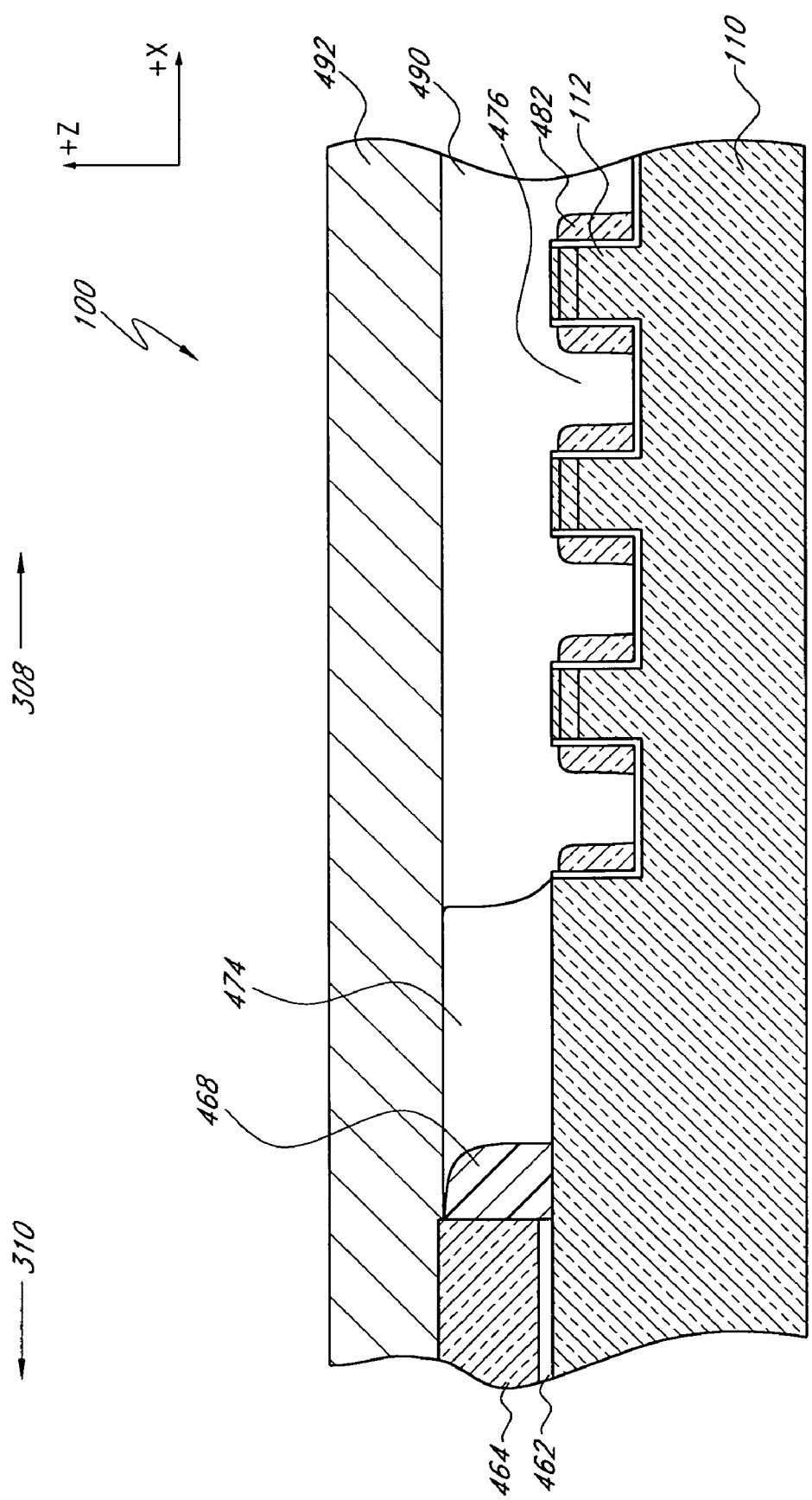
FIG. 24 illustrates a cross-sectional view in the xz plane of the partially formed semiconductor device in an embodiment wherein a self-aligned silicidation process is used to create a silicide region on polycrystalline gate stacks.

Referring now to FIG. 24, in certain embodiments, wafer contamination and refresh problems are addressed by eliminating the tungsten silicide layer 454 deposition illustrated in FIG. 15. In such embodiments, the tungsten silicide layer 454 is replaced with an extended thickness polycrystalline silicon layer, illustrated as layer 464 in FIG. 24. After the intermediate trenches 476 and sidewall spacers 482 are formed, as illustrated in FIG. 21, an insulating layer 490, such as a SOD material, is blanket deposited over the array region 308. A CMP process is then performed to expose polycrystalline silicon 464 at the tops of the gate stacks in the device periphery region 310. A self-aligned silicidation process is then performed by first depositing a metal layer 492. The resulting structure is illustrated in FIG. 24. Subsequently, a silicidation anneal is conducted to react the metal 492 (for example, titanium) in a self-aligned manner where it contacts the polycrystalline silicon layer 464. Subsequently, unreacted metal 492 can be selectively etched, as in known in the art.

For example, in one embodiment between about 500 Å and about 1000 Å of the exposed polycrystalline silicon is converted to titanium silicide. Other silicide materials, such as tungsten silicide, ruthenium silicide, tantalum silicide, cobalt silicide or nickel silicide, are formed in other embodiments. This configuration advantageously allows the metal deposition step illustrated in FIG. 15 to be eliminated, thereby reducing or eliminating metal contamination of the substrate and also simplifying removal of the sacrificial gate material (now just one layer of silicon) in the array 308. The embodiment of FIG. 24 takes advantage of the fact that an insulating cap layer (for example, silicon nitride) is not needed for the peripheral transistors, because the dimensions of such transistors are not so tight as to require self-aligned contacts in the region 310.

In another embodiment (not shown), a three-sided U-shaped transistor is formed. In such embodiments, the shallow trenches 404 are filled with a non-silicon oxide filler material, such as silicon nitride, at the stage of FIG. 11. Then, before forming the sidewall spacers 482 in the intermediate trenches 476, a selective etch is used to remove the filler material from the shallow trenches 404. When the sidewall spacers 482 are formed, semiconductor material is also formed in the shallow trenches 404. Because the shallow trenches 404 are narrower than the intermediate trenches 476, the deposition of the sidewall spacers 482 fills the shallow trenches 404. Accordingly, the subsequent spacer etch merely recesses the gate material within the shallow trenches 404 below the level of the tops of the source/drain regions. This process creates a three-sided transistor structure. Advantageously, the gate material bridges the row of U-shaped protrusions forming the sidewall gate regions on both sides and equalizing potential. Additional details regarding this process are provided in FIGS. 32-35 and the corresponding written description of U.S. patent application Ser. No. 10/933,062 (filed 1 Sep. 2004), the entire disclosure of which is hereby incorporated by reference herein.

The fabrication techniques disclosed herein advantageously enable the forming of active devices in the periphery region and the patterning of intermediate trenches in the array region with a single mask. In embodiments wherein two are combined to define features in the periphery and array simultaneously, a second mask is used to separate the periphery and array regions for different subsequent processing steps. Advantageously, this second mask is not critical, and thus is easily aligned over existing structures on the substrate. Furthermore, the fabrication techniques disclosed herein are also applicable to other applications. For example, such techniques are usable to form single transistor, single capacitor DRAM cells.

In certain of the embodiments described herein, the same materials that are used to form active devices in the periphery region 310 are also used as sacrificial material for subsequent masking processes in the array region 308. Examples of such materials include the polycrystalline silicon layer 452 and optionally, the tungsten silicide layer 454. This advantageously eliminates the need to use two different critical masks to separately form features in the device periphery region 310 and device array region 308.

Additionally, the material used to form the gate electrode sidewall spacers 482 in the device periphery region 310 is also used as a hard mask material in the device array region 308. In one embodiment, as illustrated in FIG. 17, deposition of the silicon nitride spacers 468 fill the gaps between the lines 470 in the array region 308.

SCOPE OF THE INVENTION

While the foregoing detailed description discloses several embodiments of the present invention, it should be understood that this disclosure is illustrative only and is not limiting of the present invention. It should be appreciated that the specific configurations and operations disclosed can differ from those described above, and that the methods described herein can be used in contexts other than vertical gated access transistors.

I claim:

1. A method comprising:
    patterning a first plurality of semiconductor structures in an array portion of a semiconductor substrate using a first photolithographic mask;
    providing at least one gate layer in a logic portion of the semiconductor substrate and at least one sacrificial layer in the array portion of the semiconductor substrate;
    after patterning the first plurality of semiconductor structures, patterning a plurality of gate structures from the gate layer over the logic portion of the semiconductor substrate using a second photolithographic mask;
    patterning the sacrificial layer over the first plurality of semiconductor structures using the second photolithographic mask, wherein patterning the plurality of gate structures and patterning the sacrificial layer are performed simultaneously;
    using the patterned sacrificial layer to define a hard mask over the array portion of the semiconductor substrate, wherein a hard mask material is deposited between features of the patterned sacrificial layer; and
    subsequently removing all of the patterned sacrificial layer.

2. The method of claim 1, wherein the sacrificial layer comprises polycrystalline silicon.

3. The method of claim 1, wherein the first plurality of semiconductor structures are recessed into the semiconductor substrate.

4. The method of claim 1, wherein the first plurality of semiconductor structures are recessed below the plurality of gate structures.

5. The method of claim 1, wherein the first plurality of semiconductor structures are U-shaped transistor structures.

6. The method of claim 1, wherein the plurality of gate structures form part of planar transistor structures.

7. The method of claim 1, further comprising performing an ion implantation technique to dope selected portions of the first semiconductor structures.

8. The method of claim 1, wherein the plurality of gate structures comprises a polycrystalline silicon region.

9. The method of claim 8, wherein the plurality of gate structures further comprises a gate dielectric layer positioned between the logic portion of the semiconductor substrate and the polycrystalline silicon region.

10. The method of claim 1, wherein the plurality of gate structures comprises a silicide region.

11. The method of claim 1, wherein patterning the first plurality of semiconductor structures over the array portion of the semiconductor substrate comprises:
    forming a plurality of elongate shallow trenches; and
    forming a plurality of elongate deep trenches positioned substantially parallel to the plurality of elongate shallow trenches.

12. The method of claim 11, wherein forming the plurality of elongate shallow trenches and the plurality of elongate deep trenches comprises performing a pitch multiplication process.

13. The method of claim 11, wherein patterning the first plurality of semiconductor structures over the array portion of the semiconductor substrate further comprises filling the elongate shallow trenches and the elongate deep trenches with an oxide material.

14. The method of claim 1, wherein the semiconductor substrate comprises single crystal silicon.

15. The method of claim 1, further comprising depositing a conformal insulating layer over the second plurality of semiconductor structures.

16. The method of claim 15, wherein:
    patterning the sacrificial layer comprises forming a plurality of gaps in the sacrificial layer, the gaps having a gap spacing; and
    the conformal insulating layer has a thickness that is at least half the gap spacing.

17. The method of claim 15, further comprising etching the conformal insulating layer from horizontal surfaces in the array and logic portions of the semiconductor substrate.

18. The method of claim 17, wherein etching the conformal insulating layer forms a plurality of sidewall spacers adjacent the second plurality of semiconductor structures over the logic portion of the semiconductor substrate.

19. The method of claim 15, wherein the conformal insulating layer comprises silicon nitride.

20. The method of claim 1, wherein subsequently removing all of the patterned sacrificial layer is conducted after defining the hard mask.

21. The method of claim 20, further comprising etching a plurality of trenches through the hard mask and into the array portion of the semiconductor substrate after removing the patterned sacrificial layer.

22. The method of claim 21, further comprising forming a plurality of elongate sidewall spacers adjacent to vertical sidewalls of the plurality of trenches etched into the array portion of the semiconductor substrate.

23. The method of claim 22, wherein the plurality of elongate sidewall spacers comprises a semiconductor material.

24. The method of claim 22, further comprising an oxide layer positioned between the plurality of elongate spacers and the vertical sidewalls of the plurality of trenches etched into the array portion of the semiconductor substrate.

25. The method of claim 1, wherein the gate layer and the sacrificial layer comprise the same conductive layer in the array and logic portions.

26. The method of claim 25, wherein patterning the gate layer and patterning the sacrificial layer comprises masking the gate layer and the sacrificial layer and etching a conductive layer and an underlying dielectric layer.

* * * * *